United States Patent
Ostergaard et al.

(10) Patent No.: US 9,350,062 B2
(45) Date of Patent: *May 24, 2016

(54) STRESS RELIEVED HIGH POWER RF CIRCUIT

(71) Applicant: Anaren, Inc., East Syracuse, NY (US)

(72) Inventors: Hans P. Ostergaard, Viborg (DK);
Michael J. Len, Skaneateles, NY (US);
Chong Mei, Jamesville, NY (US); Brian K. Buyea, Chittenango, NY (US)

(73) Assignee: ANAREN, INC., East Syracuse, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/457,653

(22) Filed: Aug. 12, 2014

(65) Prior Publication Data

US 2016/0049713 A1 Feb. 18, 2016

(51) Int. Cl.
| | |
|---|---|
| *H01P 3/08* | (2006.01) |
| *H01P 11/00* | (2006.01) |
| *H01L 23/498* | (2006.01) |
| *H01L 23/66* | (2006.01) |
| *H01P 1/203* | (2006.01) |
| *H05K 1/03* | (2006.01) |

(52) U.S. Cl.
CPC .......... *H01P 3/081* (2013.01); *H01L 23/49833* (2013.01); *H01L 23/66* (2013.01); *H01P 1/20345* (2013.01); *H01P 11/003* (2013.01); *H05K 1/036* (2013.01); *H01L 2223/6627* (2013.01)

(58) Field of Classification Search
CPC .......... H05K 1/02; H05K 1/00; H01P 11/003; H01P 3/081
See application file for complete search history.

(56) References Cited

U.S. PATENT DOCUMENTS

| 4,647,508 A | 3/1987 | Gazit et al. |
|---|---|---|
| 6,353,189 B1 | 3/2002 | Shimada et al. |

(Continued)

FOREIGN PATENT DOCUMENTS

EP    0872890    10/1998

OTHER PUBLICATIONS

International Search Report Form PCT/ISA/220, International Application No. PCT/US2015/044811, pp. 1-13, Dated Nov. 27, 2015.

*Primary Examiner* — Roy Potter
(74) *Attorney, Agent, or Firm* — Bond Schoeneck & King, PLLC; Daniel Malley; George McGuire

(57) ABSTRACT

The present invention is directed to an RF device that includes a laminate structure having a ceramic layer having a predetermined thermal conductivity that is a function of a predetermined RF device operating temperature. The ceramic layer forms a first major surface of the laminate structure and a second major ceramic surface is bonded to a layer of thermoplastic material that is, in turn, bonded to a conductive layer. The thermoplastic material has a coefficient of thermal expansion that substantially matches the conductive layer. A first circuit arrangement is disposed on the first major surface of the laminate structure and it includes a first RF circuit structure having a predetermined geometry and predetermined electrical characteristics. The laminate structure is configured to dissipate thermal energy generated by the at least one first RF circuit structure via substantially the entire second major surface of the laminate structure.

38 Claims, 15 Drawing Sheets

(56) References Cited

U.S. PATENT DOCUMENTS

| | | |
|---|---|---|
| 7,728,694 B2 | 6/2010 | Jensen et al. |
| 8,969,733 B1 * | 3/2015 | Mei .................. H05K 1/02 174/252 |
| 2002/0092676 A1 | 7/2002 | Jimarez et al. |
| 2009/0027143 A1 | 1/2009 | Jensen et al. |
| 2012/0222888 A1 | 9/2012 | Zhang |

* cited by examiner

TYPICAL LTCC OR HTCC CONDUCTOR CROSS SECTIONAL SHAPE

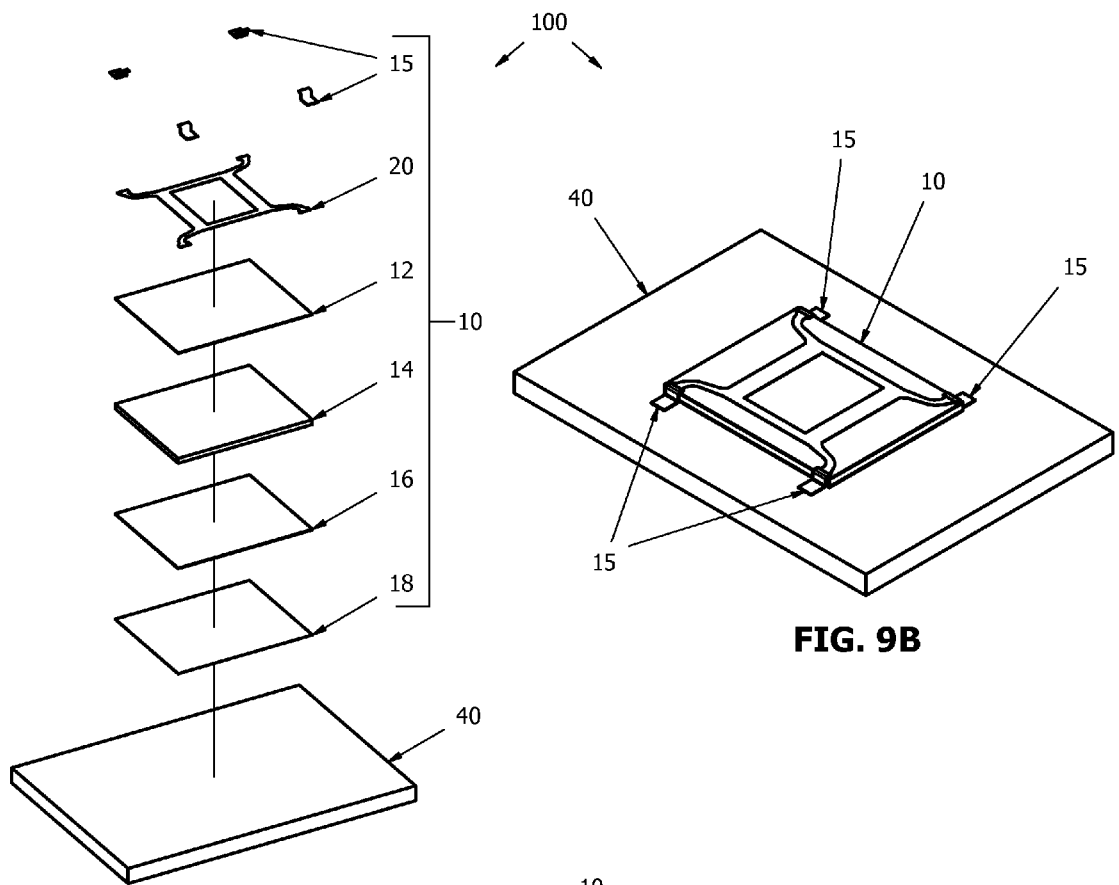
FIG. 9A
FIG. 9B
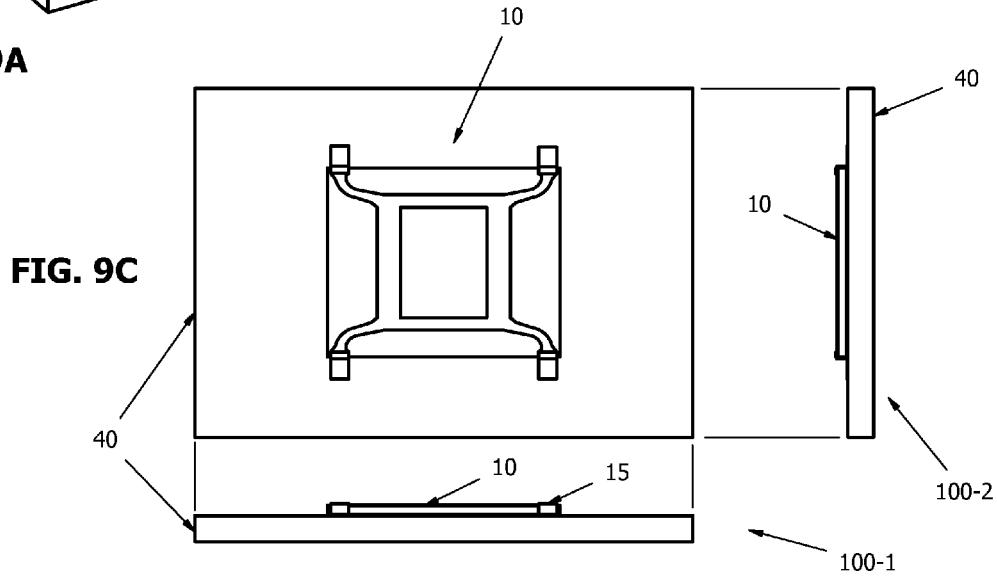
FIG. 9C

STRESS RELIEVED HIGH POWER RF CIRCUIT

BACKGROUND OF THE INVENTION

1. Field of the Invention

The present invention relates generally to RF devices, and particularly to relatively high power RF devices with improved thermal characteristics.

2. Technical Background

The primary use of some mobile phones (e.g., smartphones) is data communications rather than voice communications. More and more of the public is using their mobile telephones for Internet access, social media access and for downloading videos and pictures from both of these sources. Thus, the demand for mobile data services is growing at an exponential rate. This necessarily means that the bandwidth provided by the telecommunications infrastructure (as well as the mobile telephone handset itself) must continue to grow if it is to keep pace with the demand. In order to accomplish this, new mobile telephone handsets and new base station equipment must be configured to operate over multiple frequency bands and communications systems (e.g., Wi-Fi, 3G, 4G, Bluetooth, etc.). Stated differently, new mobile telephones and base stations must provide more functionality in the same (or less) space. Because radio frequency (RF) devices such as power amplifiers, couplers, baluns, etc., are integral parts of every wireless device or system, they must also do more in a smaller footprint. Accordingly, size reduction, improved heat dissipation, power handling, and cost reduction are important considerations for today's RF component designs.

Referring to FIG. 1, a sectional view of a conventional softboard RF device 1 is shown. The RF device 1 includes three softboard layers (1, 2, and 3) that are laminated together to form an integrated device. Before lamination is performed, conductive traces 4 are disposed on the middle softboard layer 2 by way of conventional photolithographic methods. One of the advantages of using all-softboard related devices relates to their excellent electrical performance. One reason for this is that softboard devices use photolithographic processes for circuit trace fabrication; photolithography produces excellent conductive traces (i.e., high purity copper traces that have an excellent shape) that exhibit low conductor resistivity (e.g., Cu-1.7 μΩ-cm; Ag-1.55 μΩ-cm; and Au-2.2 μΩ-cm). Moreover, softboard devices are easily configured to match the coefficient of thermal expansion (CTE) of the SMT carrier printed circuit board (PCB). As a result, the reliability of softboard devices is typically excellent. Finally, softboard devices are amenable to being manufactured in large batches, which typically results in lower costs.

On the other hand, the maximum power handling ability of softboard based RF circuits is relatively low because they are characterized by relatively poor thermal conductivity and poor Maximum Operating Temperature (MOT). Power Handing is a function of thermal conductivity, electrical performance, circuit geometry, MOT and part size. MOT is a function of material properties. A typical glass-epoxy laminate printed circuit board (PCB), such as FR4, has a MOT of 130° C. Teflon based PCB materials have a MOT up to 280° C. Polyamides have a MOT>200° C. Copper has an MOT of 130° C. in air. The material with the lowest MOT, of course, sets the limit for the entire system. Standard softboard dielectrics thus have a relatively low thermal conductivity of about 0.25 W/mK up to 1 W/mK, with doped softboard dielectrics reaching up to about 3 W/mK.

Referring to the heat distribution pattern 5 shown in FIG. 1, the amount of heat that is laterally conducted by softboard type devices is rather limited. Those skilled in the art assume that the thermal energy generated by all-softboard devices dissipates at about a 45° angle through the softboard dielectric materials. Thus, the thermal distribution pattern 5 is limited to a small region on each major surface of the device 1. Accordingly, one drawback to this approach is that the thermal energy is dissipated over a rather small surface area, and as a result, the thermal energy builds up over time and becomes problematic. Stated differently, the amount of power that a device can handle is limited by its heat dissipation capabilities. All-softboard devices typically exhibit a low maximum continuous operating temperature (e.g., about 120° C. to 200° C. typical). The glass transition temperature (Tg) is also relatively low (e.g., 75° C. to 150° C. being typical values for standard PCB materials).

Referring to FIG. 2, a top view of the conventional softboard RF device depicted in FIG. 1 is shown. This view represents a typical configuration that provides three edge vias 6 on each side thereof, with one edge via 6 disposed on each end. Using the dimensions in the illustration, and assuming 1 mil thick copper, the surface area provided by each via is about 0.05 mm$^2$. The combined area (for three vias) is about 0.149 mm$^2$. Even if one were able to direct the thermal energy to the edge of the device, there is only a small surface area available for heat dissipation.

Thus, conventional stripline (or microstrip) designs can be implemented using softboard materials that are disposed in a relatively small package. While these devices offer some convenience, they exhibit power handling limitations (e.g., up to 100-200 W) that are due to thermal resistance and maximum operating temperature (MOT) limitations.

Instead of using softboard dielectric layers, some manufacturers produce RF circuits (e.g., couplers) using low temperature co-fired ceramic (LTCC) or high temperature co-fired ceramic (HTCC) ceramic technology. Some of the advantages of ceramic devices include: high thermal conductivity (30 W/m° C. to 170 W/m° C. typical); low thickness variations (when lapped +/−0.0005 typical); high maximum continuous operating temperatures (500° C. to 2000° C. typical); and a high glass transition temperature (Tg). On the other hand, the maximum power handling of ceramic RF devices is limited by electrical performance (where insertion loss is typically higher than similar PCB devices) and solder joint failure (due to reflow or cracked solder joint) at the device-to-carrier PCB interface (solder joint reflow often leads to failed solder joints). In the solder reflow failure mode, the RF power flowing through the device can cause an all-ceramic RF device to become so hot that the solder reflows and the device separates from the carrier PCB. Thus, the high thermal conductivity of conventional ceramic devices can lead to device failure if the power level is not limited. The cracked solder joint failure mode is typically due to the CTE mismatch between the all-ceramic RF device and the softboard carrier PCB (Ceramic exhibits a CTE of about 5 ppm/° C. typical whereas the carrier PCB exhibits a CTE of about 15 to 25 ppm/° C. typical in x/y axis).

In addition, all-ceramic RF devices have a relatively low RF performance (vis á vis softboard devices) due to the conductor material and conductor shape tolerance. Thus, RF circuits based on either all-softboard or all-ceramic constructions have inherent features which limit their maximum high power rating and reliability. Moreover, when an RF device is used in a surface mount technology (SMT) assembly, the device is mounted on a carrier PCB and the thermal path is further degraded by the carrier PCB.

Referring to FIG. 3, a cross-sectional view of a conventional LTCC or HTCC (both all-ceramic) device 1 is shown.

The ceramic device 1 includes three ceramic layers (2, 3 and 4) with traces 5 formed on the center ceramic layer 3. In this view, the cross-sectional shape of the conductor 5 is of interest. A conventional all-ceramic RF device 1 typically employs a process whereby the circuit traces are screen printed. In one approach, a thick film conductive paste is disposed on a ceramic substrate to implement the conductive portions of the circuits. The conductive traces 5 exhibit high resistivity due to porosity and impurities. The high resistivity of the conductors 5 is a result of the materials used in the screen printing process; i.e., the conductors 5 are made from an Ag or a W (5.7 microohm-cm) paste. Moreover, the cross-sectional shape of the conductive traces 5 is not conducive to high RF performance. In another conventional approach, a thin film sputtering layer is disposed on ceramic to implement the circuitry, which eliminate the above issue, however the thickness of the conductors are very thin, and not conducive to high power handling. Accordingly, the electrical performance of ceramic RF devices is relatively poor in comparison to softboard devices. Finally, the size of the footprint of a panel of ceramic devices (before singulation) is relatively small (e.g., about 4"×4" to 6"×6") as compared to softboard panels (which may be 12"×18" to 18"×24" before singulation). The thick-film approach also yields relatively large line width tolerances unless secondary etching processes are employed. Obviously, each additional process step that must be included in the overall process results in additional costs.

FIG. 4 represents a hybrid approach that attempts to take advantage of the benefits associated with sailboard and ceramic devices, while eliminating or mitigating their disadvantages. Specifically, FIG. 4 is a detail view that shows a four port coupler component 1000 that includes two planar transmission lines 1142 and 1144 disposed between two ground planes 1020. The transmission lines 1142 and 1144 are formed on the upper and lower surfaces, respectively, of the inner dielectric layer 1146. Disposed between transmission line conductors 1142, 1144 and ground planes 1020 are the upper dielectric layer 1012 and lower ceramic puck 1160, respectively. The puck is disposed in a pocket 1016-1 formed in softboard layer 1016. The dielectric layers 1012, 1016, and 1146 are formed using any suitable type of circuit board material, e.g., FR-4, PYRALUX®, ROGERS RO3003®, etc. Layer 1146 includes transmission lines 1142 and 1144 disposed on either side thereof. The transmission lines 1142 and 1144 are formed using photolithographic techniques. The vias (e.g. 1200, 1120, 1148 and 1600) are formed using plated through holes (PTH) to provide interconnections between internal metal layers and internal metal layers to external metal layers.

While the approach considered in FIG. 4 may represent an improvement over softboard devices (with respect to power handling), there are also drawbacks that must be considered. In this approach, each individual device 1000 requires a small individual ceramic puck 1160 placed in pockets 1016-1 for each individual device. One drawback to this approach is, therefore, that each puck cavity requires tight positional tolerance for the ceramic puck insert. In addition, the conductors 1142 and 1144 are used to realize a stripline configuration disposed between two softboard layers 1012 and 1016. Accordingly, the thermal path is somewhat degraded by the two softboards (1012, 1016). Another drawback relates to the additional process steps required to implement the devices. For example, each device requires plated through-hole interconnections between internal metal layers to external metal layers. In addition, the process uses bonding layers 1018 between certain layers.

Having completed a brief survey of conventional RF techniques, the discussion now turns to the environment in which each of these devices (i.e., softboard, ceramic and hybrid composite) are typically used. To be specific, the conventional devices described above are typically mounted on an end-user's printed circuit board and interfaced to the end-user's control circuitry, amplifier and/or load. Often, conventional power amplifiers are fabricated using SMT plastic over-molded transistors that consist of a transistor die mounted to a copper slug (for heat dissipation purposes); these elements are covered by a plastic over-mold. The amplifier is mounted on a carrier PCB or in a cutout of a PCB (for improved heat dissipation). In the case of a flip chip amplifier, the amplifier is mounted on a PCB (or ceramic board) that is subsequently mounted on a copper plate that functions as a heat sink. In both cases, the transistor I/O pads must be connected to the corresponding PCB pads by solder connections. Moreover, one should not forget that the amplifier transistors have input and output impedances that are significantly lower than the 50 Ohm system impedance. Thus, both input and output impedance matching networks are usually required. Briefly stating the above, the interconnections and the matching networks take up too much end-application circuit board "real estate."

Based on the drawbacks outlined above, what is needed is an improved RF device that provides relatively low insertion loss (IL) and low thermal stress, while exhibiting relatively high thermal conductivity. An RF device is needed that provides high power handling capability and low manufacturing cost. What is also needed is an RF device that exhibits "end application" flexibility. Stated differently, an RF device that can be mounted in a variety of end-application environments to eliminate non-value added interfaces is very desirable. As those skilled in the art will appreciate, the elimination of duplicative interfaces and interconnections could go a long way toward reducing the size and cost of RF assemblies while improving their overall performance.

SUMMARY OF THE INVENTION

The present invention addresses the needs described above by providing an RF device that provides good electrical performance and exhibits low thermal stress, while providing relatively high thermal conductivity and MOT. For example, the coupler of the present invention can handle average RF power in excess of 1,000 Watts (W). The present invention is directed to an RF coupler that provides improved reliability at lower cost by substantially minimizing or eliminating solder joint interfaces (by replacing I/O printed circuit board solder joint interfaces), vertical transitions, bonding films, expensive materials and unneeded process steps, without sacrificing performance. The present invention is also directed to an RF device that exhibits end application flexibility because it can be mounted in a variety of end-application environments such that duplicative interfaces and interconnections are eliminated. For the above stated reasons, the present invention is substantially directed toward reducing the size and cost of RF assemblies while improving their overall performance.

One aspect of the present invention is directed to an RF device that includes a laminate structure having a first layer of thermoplastic material characterized by a modulus of elasticity that is a function of the RF device operating temperature. A first major surface of the first layer of thermoplastic material substantially forms a first major surface of the laminate structure. A second major surface of the first layer of thermoplastic material is bonded to a first major ceramic surface of a ceramic layer having a predetermined thermal conductivity that is a function of a predetermined RF device operating temperature. The ceramic layer has a second major ceramic surface bonded to a second layer of thermoplastic material. The second layer of thermoplastic material is bonded to a conductive layer that forms a second major surface of the laminate structure. The second layer of thermoplastic material has a coefficient of thermal expansion that substantially matches the conductive layer. The device also includes a first circuit arrangement disposed on the first major surface of the laminate structure. The first circuit arrangement includes at least one first RF circuit structure having a predetermined geometry and predetermined electrical characteristics in accordance with the predetermined RF device operating temperature. The laminate structure is configured to dissipate thermal energy generated by the at least one first RF circuit structure via substantially the entire second major surface of the laminate structure.

In one embodiment, the predetermined thermal conductivity of the ceramic layer is substantially within a range between about 3 W/mK and 300 W/mK.

In another embodiment, the coefficient of thermal expansion of the second layer of thermoplastic material is substantially within a range between 15 ppm/° C. and 25 ppm/° C.

In yet another embodiment, the ceramic layer is selected from a group of materials that include alumina ($Al_2O_3$), Aluminum Nitride (AlN) or Beryllium Oxide (BeO).

In yet another embodiment, at least one of the first layer of thermoplastic material and the second layer of thermoplastic material are comprised of a PTFE material. In a version of this embodiment, the PTFE materials are doped with a ceramic filler material.

In yet another embodiment, the at least one first RF circuit structure and the conductive layer form at least one microstrip RF circuit.

In yet another embodiment, the first circuit arrangement includes I/O pads coupled to the at least one RF circuit structure and substantially disposed on the first major surface of the laminate structure. In a version of this embodiment, the laminate structure is characterized by a two-dimensional footprint corresponding to an end-application mounting interface.

In yet another embodiment, the first circuit arrangement includes a third layer of thermoplastic material configured to substantially encapsulate the first major surface of the laminate structure.

In yet another embodiment, the first circuit arrangement includes a third layer of thermoplastic material coupled to a second circuit arrangement substantially parallel to the first RF circuit. In a version of this embodiment, the second circuit arrangement includes monitoring circuitry or control circuitry coupled to the first RF circuit. In another version of this embodiment, the second circuit arrangement includes a second RF circuit. In one alternate version, the first RF circuit and the second RF circuit are configured to form an RF arrangement selected from a plurality of RF arrangements including a cross over arrangement, a coupling arrangement, or a matching network arrangement.

In yet another embodiment, the first circuit arrangement includes a power sampling coupler arrangement electromagnetically coupled to the at least one RF circuit structure and substantially disposed on the first major surface of the laminate structure.

In yet another embodiment, the laminate structure includes no conductive vias or through-holes formed therein.

In yet another embodiment, the RF device is employed in an RF assembly that includes a mounting interface characterized by a two-dimensional footprint. The laminate structure is disposed on the mounting interface. The mounting interface has a coefficient of thermal expansion (CTE) substantially matched to the conductive layer. The RF assembly further includes at least one RF element coupled to the first circuit arrangement. In one version, the first circuit arrangement includes I/O interconnections coupling the at least one RF element and the at least one RF circuit structure, and the I/O interconnections are substantially disposed on the first major surface of the laminate structure. In another version of this embodiment, the mounting interface is selected from a group of mounting interfaces that include a metallic flange element, a heat sink structure, a heat sink structure disposed within an opening in a printed circuit board, or a PCB. In yet another version of this embodiment, at least one RF element is selected from a group of RF elements including a transistor, an RF power amplifier, an RF load, a filter, an antenna, and an edge mounted connector.

In another aspect, the present invention is directed to an RF device that includes a laminate structure having a ceramic layer that has a predetermined thermal conductivity that is a function of a predetermined RF device operating temperature. The ceramic layer has a first major ceramic surface that forms a first major surface of the laminate structure and a second major ceramic surface bonded to a layer of thermoplastic material. The layer of thermoplastic material is bonded to a conductive layer that forms a second major surface of the laminate structure. The layer of thermoplastic material has a coefficient of thermal expansion that substantially matches the conductive layer. A first circuit arrangement is disposed on the first major surface of the laminate structure, the first circuit arrangement including at least one first RF circuit structure having a predetermined geometry and predetermined electrical characteristics in accordance with the predetermined RF device operating temperature. The laminate structure is configured to dissipate thermal energy generated by the at least one first RF circuit structure via substantially the entire second major surface of the laminate structure.

In one embodiment, the predetermined thermal conductivity of the ceramic layer is substantially within a range between about 3 W/mK and 300 W/mK.

In another embodiment, the coefficient of thermal expansion of the layer of thermoplastic material is substantially within a range between 15 ppm/° C. and 25 ppm/° C.

In yet another embodiment, the ceramic layer is selected from a group of materials that include alumina ($Al_2O_3$), Aluminum Nitride (AlN) or Beryllium Oxide (BeO).

In yet another embodiment, the layer of thermoplastic material is comprised of a PTFE material. In one version, the PTFE materials are doped with a ceramic filler material.

In yet another embodiment, the at least one first RF circuit structure and the laminate layer form at least one microstrip RF circuit.

In yet another embodiment, the first circuit arrangement includes I/O pads coupled to the at least one RF circuit structure and substantially disposed on the first major surface of the laminate structure.

In yet another embodiment, the first circuit arrangement is formed using a process selected from a group of processes including a thick film metallization process, a thin film metallization process, and a direct plate copper (DPC) process.

In yet another embodiment, the laminate structure includes no conductive vias or through-holes formed therein.

In yet another aspect, the present invention is directed to a method of making an RF device. The method includes the step of providing a ceramic layer having a predetermined thermal conductivity that is a function of a predetermined RF device operating temperature. A second layer of thermoplastic material and a conductive layer are also provided. The first layer, the ceramic layer, the second layer and the conductive layer in sequence are assembled to form a device stack-up. The stack-up is laminated to form a laminate structure, the second layer of thermoplastic material having a coefficient of thermal expansion that substantially matches the conductive layer.

In one embodiment, the method further comprises the step of providing a first layer of thermoplastic material characterized by a modulus of elasticity that is a function of the RF device operating temperature.

In another embodiment, the method further comprises the step of forming a first circuit arrangement on the first major surface of the laminate structure. The first circuit arrangement includes at least one first RF circuit structure having a predetermined geometry and predetermined electrical characteristics in accordance with the predetermined RF device operating temperature. The laminate structure is configured to dissipate thermal energy generated by the at least one first RF circuit structure via substantially the entire second major surface of the laminate structure.

In yet another embodiment, the predetermined thermal conductivity of the ceramic layer is substantially within a range between about 3 W/mK and 300 W/mK.

In yet another embodiment, the coefficient of thermal expansion of the second layer of thermoplastic material is substantially within a range between 15 ppm/° C. and 25 ppm/° C.

In yet another embodiment, the ceramic layer is selected from a group of materials that include alumina ($Al_2O_3$), Aluminum Nitride (AlN) or Beryllium Oxide (BeO).

In yet another embodiment, at least one of the first layer of thermoplastic material and the second layer of thermoplastic material is comprised of a PTFE material. In one version of this embodiment, the PTFE materials are doped with a ceramic filler material.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

FIGS. 9A-9C are directed to various views of an RF assembly in accordance with yet another embodiment of the present invention;

DETAILED DESCRIPTION

Figure 1:
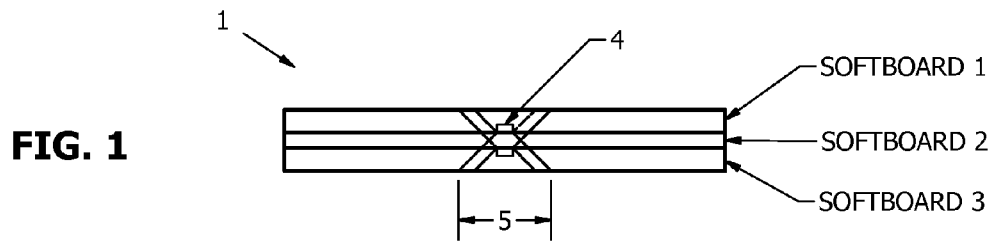
FIG. 1 is a sectional view of a conventional softboard layered RF device.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the stress relieved high power circuit of the present invention is shown in FIG. 5A, and is designated generally throughout by reference numeral 10.

Figure 5A:
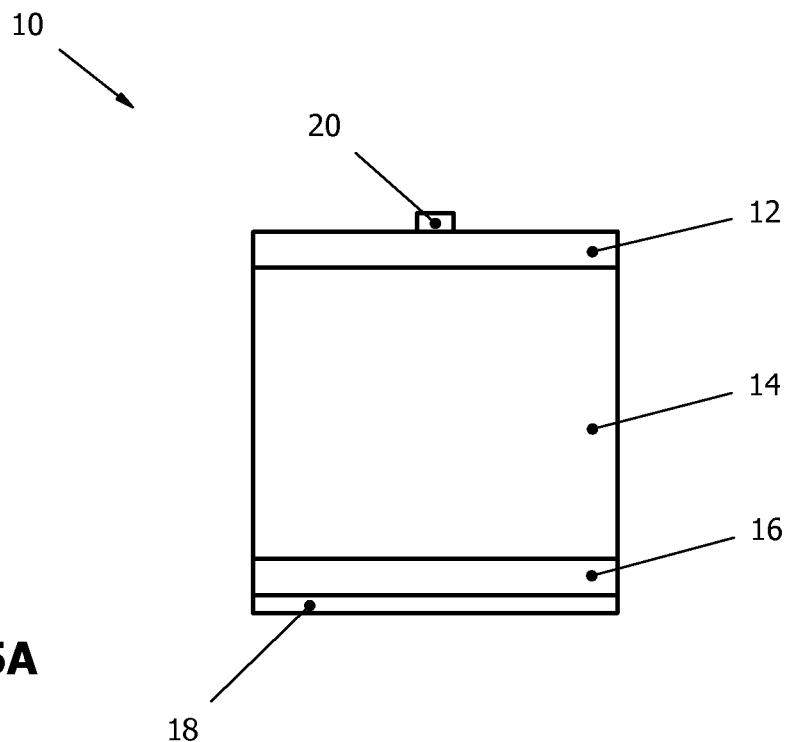
FIGS. 5A-5B are cross-sectional diagrams of an RF device in accordance with the present invention.

As embodied herein, and depicted in FIG. 5A, a cross-sectional diagram of an RF coupler 10 in accordance with one embodiment of the present invention is disclosed. Specifically, a circuit layer 20 is disposed overtop a laminate comprised of various layers of dielectrics including low modulus dielectric layer 12, ceramic core 14, and another low modulus dielectric layer 16. A conductive ground plane 18 is disposed on the underside of the dielectric layer 16 to complete the microstrip circuit. In one version of this embodiment, the circuit layer 20 is configured as a microstrip circuit layer.

Figure 5B:
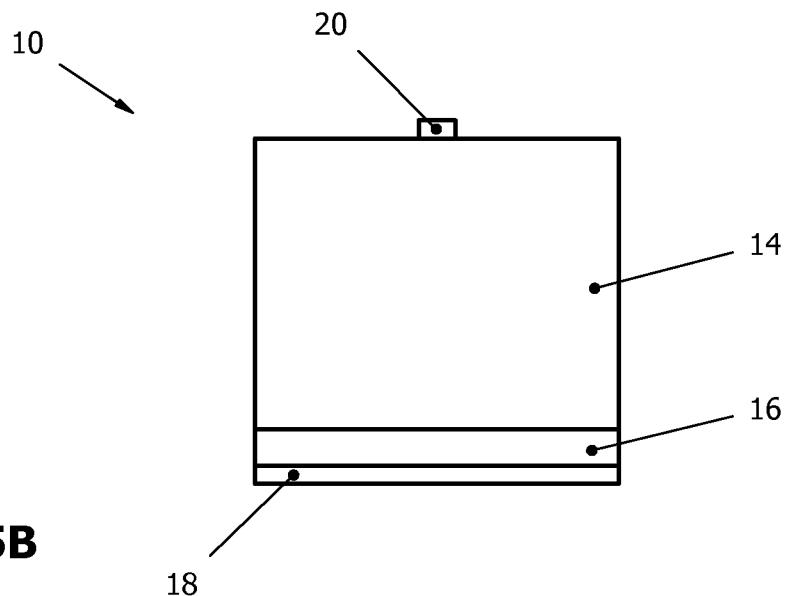

Referring to FIG. 5B, a cross-sectional diagram of an RF coupler 10 in accordance with an alternate embodiment of the present invention is disclosed. In this embodiment, a circuit layer 20 is disposed on a laminate comprised of a ceramic core 14 and a low modulus dielectric layer 16. A conductive ground plane 18 is disposed on the underside of the dielectric layer 16 to complete the circuit layer 20. The circuit metallization can be applied directly to the ceramic dielectric layer 14 by several means including a thick film metallization method, a thin film sputtering method or a direct plate copper method (DPC). All things being equal, the stack-up depicted in FIG. 5B will have lower thermal resistance characteristics than the embodiment of FIG. 5A due to the elimination of dielectric layer 12.

One of the key features of the present invention is the use of materials such as Alumina ($Al_2O_3$), Aluminum Nitride (AlN) or Beryllium Oxide (BeO) to form the ceramic layer 14. The thermal conductivity of the ceramic layer 14 is extremely high and functions to dissipate the heat generated by the RF power over the entire footprint of the device; the thermal energy is thus effectively dissipated via the bottom thermoplastic layers 16, 18 (which typically rest on PCB or heat sink layer which is not shown in this view). At the same time, the lower layer 16 features a relatively low modulus of elasticity (<300 ksi), high thermal conductivity (>1 W/mK), high maximum operating temperature (>200° C.) and coefficient of thermal expansion (CTE) of approximately 17 ppm/° C. which can be precisely matched to the conductive layer 18. In one embodiment, the conductive material used to implement layer 18 is Copper. In one version of this embodiment, the Copper is implemented as a Copper foil material.

In one embodiment of the present invention, thermoplastic layer 16 may be implemented using any suitable high thermal conductivity (HTC) softboard material. In one embodiment of the present invention, the thermoplastic material may be implemented using a PTFE material. In another embodiment, the thermoplastic material of layer 16 is implemented using a PTFE material that is doped with a ceramic material. In yet another embodiment of the present invention, layer 16 is implemented using a softboard material (e.g., of the type that is manufactured by Rogers Corp such as RO3035HTC, RO3006HTC, RO6035HTC, etc.; or by Arlon, such as TC350, TC600, etc.). The softboard material may include a copper foil that conveniently implements conductive layer 18. Stated briefly, layer 16 functions as a stress relief that prevents interconnective solder layers, or the ceramic layer 14, from cracking due to CTE mismatch between the ceramic layer 14 and the end application mounting surface. The mounting surface can be a PCB material, a heat sink material (e.g., typically Aluminum) or a mounting flange material (typically Copper). Because an HTC material is used to implement layer 16, it has relatively good heat transfer characteristics. Thus, thermoplastic layer 16 and ceramic layer 14 do an excellent job of transferring the thermal energy to the heat sink disposed there the device 10. Without the dielectric layer 16, the size of an all-ceramic device is limited to approximately a quarter square inch surface area (or significantly smaller) for certain end applications (e.g., like wireless infrastructure applications) that experience relatively high temperature ranges and a high number of thermal cycles. In other words, relatively large ceramic devices represent a high risk of cracking due to CTE mismatch. The dielectric layer 16 eliminates this problem. One may contemplate other solutions to the problems identified by the present invention (e.g., using metals that have a CTE closer to the ceramic, such as Tungsten, Molybdenum, CW85, AlSiC, etc.), but those skilled in the art will appreciate that these "solutions" have significant drawbacks. For example, while the CTEs of these materials are similar to the CTE of ceramic, they are also very expensive. Moreover, these materials are difficult to machine/fabricate to realize the desired shape. As such, the cost of implementing a part using these materials may be tenfold that of the present invention. Briefly stated, if a compliant stress reducing layer having a CTE substantially matched to the ceramic layer (i.e., layer 16) is not employed, then the temperature range must be limited to keep the stress due to the CTE mismatch to a safe level for the selected materials.

The materials used to implement the circuit layer 20 and the dielectric layer 12 may be similar to those used to implement layers 16 and 18. Layer 12 may be implemented using any suitable high thermal conductivity (HTC) thermoplastic material. In one embodiment of the present invention, the thermoplastic material is implemented using a PTFE material. In another embodiment, the thermoplastic material of layer 12 is implemented using a PTFE material that is doped with a ceramic material. In yet another embodiment of the present invention, thermoplastic layer 12 is implemented using a softboard material (e.g., of the type that is manufactured by Rogers Corp.: RO3035HTC, RO3006HTC, RO6035HTC, etc.; or Arlon: TC350, TC600, etc.). Layer 12 may include a copper foil that can be used to implement the circuit layer 20 using standard photolithographic techniques. Because standard photolithography is used to produce the circuit 20, the circuit features of circuit 20 have excellent line widths and line gaps; the HTC materials also provide good heat transfer characteristics.

The manufacturing process also offers cost and process advantages that cannot be obtained using conventional stripline circuit stackups. For example, once the layers 12-20 are stacked up, they are fusion bonded to substantially eliminate voids and air gaps in the laminate structure. By substantially eliminating or reducing the number of voids in the laminate structure, the thermal resistance is reduced to enhance the maximum operating temperature. Moreover, in most designs, the need for plated through holes (PTH) can be eliminated (e.g., PTH elimination depends on the maximum operating frequency and overall physical size of device). By eliminating vias, production costs can be significantly reduced since all of the corresponding process steps (multiple laser drilling steps, thin film sputter, conductive plating, etc.) are not required and thus eliminated. Thus, the present invention can be implemented using a relatively simple manufacturing sequence that significantly lowers costs.

All of the input and output ports (also referred to herein as pads) can be disposed on the top surface of the part. As a result, the entire bottom major surface of layer 18 can be used as a ground layer—that is directly mounted on the heat sink—to maximize the thermal path. Thus, unlike a land grid array (LGA) or other SMT style components, the RF input and output (I/O) pads do not reduce the heat transfer area (i.e., the entire bottom major surface of layer 18) an iota. Moreover, the I/O port placement provides the end-user with the option to use so-called "tab-launch" devices that can be used to directly connect device 10 to customer devices (such as power transistors). This feature eliminates the need for installing device 10 on a PCB altogether. By removing the PCB, the thermal path is substantially optimized and the temperature delta between the RF circuit and heat sink is further reduced.

Another feature of the I/O pads of present invention relates to the port-to-port spacing between the device 10 and the customer's circuit. The line lengths in circuit 20 can be designed to match the port spacing on common high power transistors (e.g., about 1.1"). In other words, the device 10 can be designed to substantially match the size of the amplifier to thus eliminate non-value added interfaces and interconnecting transmission lines.

Referring back to FIG. 5A, for example, the RF device 10 described above can be manufactured as follows. In one of the initial steps, the various layers 12-20 are selected and "stacked up." Layers 12-20 may be comprised of any of the materials described and disclosed above. (For example, layers 12 and 16 may be implemented using 5 mil Rogers 3035 HTC softboard, ceramic layer 14 may be realized by a 40 mil thick layer of $Al_2O_3$ and the conductive layers 18 and 20 implemented using 0.7 mil copper foil). The layers are then fusion bonded to form a relatively large panel. In the next step, the microstrip circuits are imaged onto layer 20 using standard photolithographic techniques. The excess copper foil is removed by an etching process. Once the circuit layer 20 is formed, the large panel is finish plated using any suitable process. For example, the panel may be finished using an electroless nickel immersion gold (ENIG) surface plating process whereby an electroless nickel plating is covered with a thin layer of immersion gold in order to protect the copper layer from oxidation. Other immersion finishes may be employed, such as tin, silver or a tin/lead alloy. Finally, the panel is singulated to provide a plurality of RF devices 10.

This process can be adapted to the device of FIG. 5B. One obvious difference between FIG. 5B and FIG. 5A is the absence of layer 12 from the device of FIG. 5B. Thus, circuit metallization (layer 20) is applied directly to the ceramic dielectric layer 14 in the manner described above (e.g., a thick film, thin film sputtering, or by DPC) to form a ceramic layer subassembly. When the thin film process is employed, for example, a seed layer is deposited (i.e., thin film sputtering) on the ceramic layer 14. The RF circuit structure is imaged onto the seed layer and subsequently etched. The ceramic layer (with the etched seed material disposed thereon) is immersed in a copper bath to plate the RF circuit structure. The options for seed layer to plate up copper include the following materials: NiCr/Cu; Cr/Cu; or Ti/Cu. After this, the subassembly, and layers 16 and 18 are fusion bonded to form a large panel. Like the previous example, the large panel is finish plated using any suitable process (ENIG, tin immersion, silver immersion, etc.) and singulated.

Figure 6:
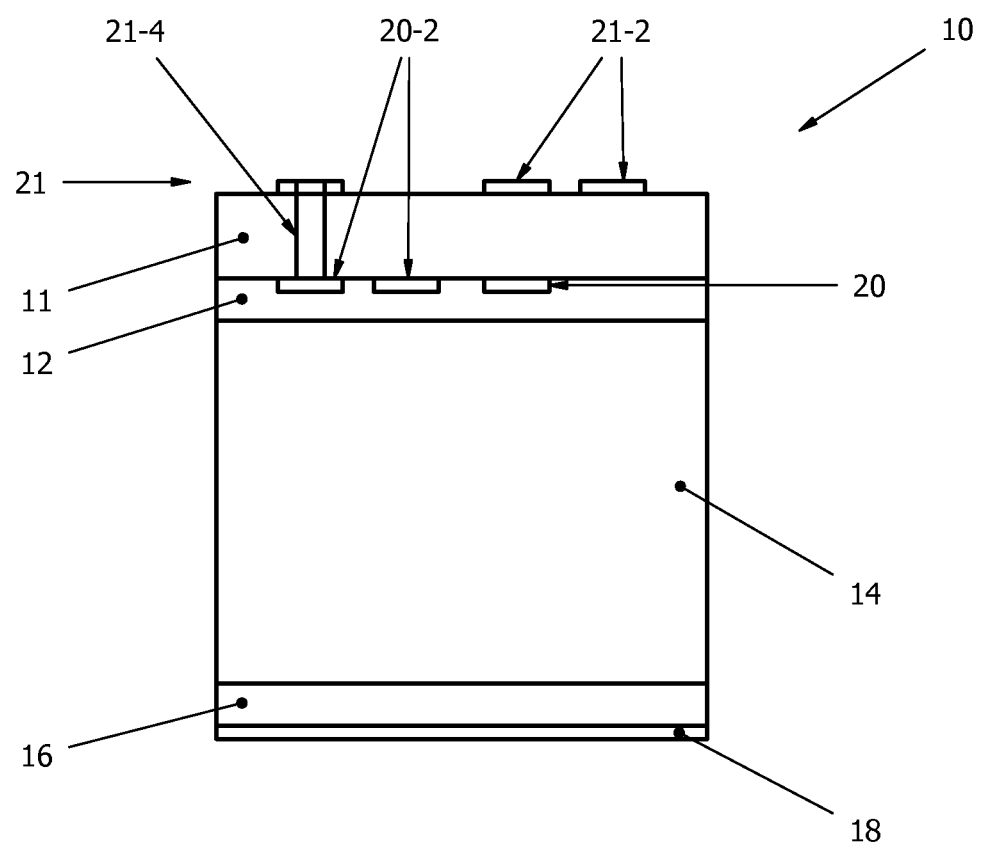
FIG. 6 is a cross-sectional diagram of an RF device in accordance with another embodiment of the present invention.

As embodied herein, and depicted in FIG. 6, a cross-sectional diagram of an RF coupler in accordance with another embodiment of the present invention is disclosed. Briefly stated, this embodiment may provide additional layers (11, 21) over the high power layers (12-20). Layers 12, 20, 11, 21 can be prefabricated using standard PCB processing methods and, in many embodiments, do not require advanced methods (such as thin film metallization, controlled depth drilling or laser drilling) that increase manufacturing complexity and cost. Like the previous embodiment, layers 12-20 are configured to provide a low cost, low RF loss, high thermal performance, and high reliability device 10. Layer 11 may be implemented using any suitable thermoplastic material. In one embodiment, a high thermal conductivity (HTC) thermoplastic material may be used to provide improved thermal performance. In one embodiment of the present invention, the thermoplastic material is implemented using a PTFE material. In another embodiment, the thermoplastic material of layer 11 is implemented using a PTFE material that is doped with a ceramic material. In yet another embodiment of the present invention, thermoplastic layer 11 is implemented using a softboard material (e.g., of the type that is manufactured by Rogers Corp: RO3035HTC, RO3006HTC, RO6035HTC, etc. Or Arlon: TC350, TC600, etc.).

As before, layer 16 may be comprised of a doped PTFE material that has a low modulus configured to reduce CTE mismatch—and thus reduce the associated stresses during thermal cycling—between the ceramic core 14 and the end application mounting surface, e.g., a metal flange, a metal heat sink or a PCB. (The most cost effective flange material is copper (Cu) which has a CTE of 17 ppm/° C. and a thermal conductivity of 390 W/mK. Heat sinks are typically comprised of aluminum (Al) materials that have a CTE of 23 ppm/° C. and a thermal conductivity of 135 W/mK. The CTE and thermal conductivity of PCBs depend on the material used and the size and quantity of plated through holes used in the PCB. Thus, the CTE and thermal conductivity of PCBs can range from 17-300 ppm/° C. and 0.2-5 W/mK respectively. Layer 16 is also somewhat thinner than the ceramic layer 14 in order to minimize the thermal resistance and maximize thermal conductivity. Obviously, layer 16 must have the required RF performance (e.g., a loss tangent of <0.003) and be bondable to both the ground layer 18 and the ceramic layer 14. Moreover, the smooth/pure copper foil that can be used to implement layers 18 and 20, and the standard photolithographic techniques used for making the circuit traces (layer 20), provide excellent line widths and line gaps that yield a low loss device.

As before, the ceramic layer 14 has a suitable dielectric constant (DK) for RF performance (e.g., DK of about 9), a loss tangent that is <0.001, and a thermal conductivity that is greater than about 20 W/mK. Layer 12 may also be comprised of a doped PTFE material that has a low modulus, and an appropriate DK and RF loss tangent (which relates to the material's inherent tendency to convert electromagnetic energy into heat). Layer 12 must be bondable to the ceramic layer 14 and the circuit trace layer 20.

The circuit trace layer 20 is configured to provide excellent RF performance by virtue of providing consistent conductive traces (e.g., width, thickness, edge profile, etc.) that maximize electrical conductivity and minimize surface roughness. When layer 20 is employed as the top layer (See, e.g., FIG. 5A), it is configured as corrosion, tarnish and oxidation resistant conductive layer that is solderable to exterior surfaces as needed. As described above, layers 12/20 and 16/18 may be implemented using a high thermal conductivity (HTC) softboard material (e.g., of the type that is manufactured by Rogers Corp, e.g., RO3035HTC, RO3006HTC, RO6035HTC, etc.; or by Arlon, e.g., TC350, TC600, etc.). This material can be equipped with a copper foil that can be used to implement metal layers 18/20.

Similarly, dielectric layer 11 and circuit layer 21 may be implemented using a high thermal conductivity (HTC) softboard material (e.g., of the type that is manufactured by Rogers Corp, e.g., RO3035HTC, RO3006HTC, RO6035HTC, etc.). This material can be equipped with a copper foil that can be used to implement the circuit 21 using standard photolithographic techniques. The dielectric layer 11 is configured to have an appropriate DK and loss tangent commensurate with the desired RF performance (e.g., a loss tangent of <0.003) and must be bondable to layers 11, 20 and 21. As before, the smooth/pure copper foil that can be used to implement layer 21, and the standard photolithographic techniques used for making its circuit traces (layer 20) provide excellent line widths and line gaps. As described herein, the conductive layer 21 may be employed to provide coupler traces, I/O pad interfaces, and/or vias. Like layer 20, it is configured to provide consistent conductive traces (e.g., width, thickness, edge profile, etc.) that maximize electrical conductivity and minimize surface roughness. And like layer 18, it is configured to be solderable and resistant to corrosion, tarnishing and oxidation.

Figure 2:
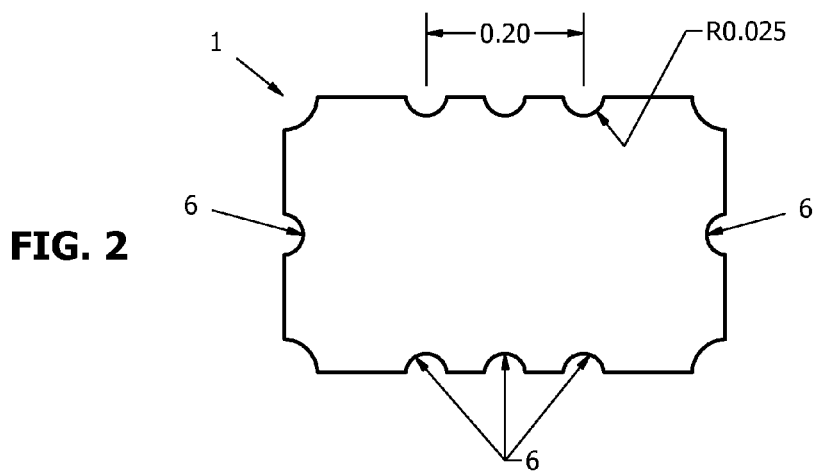
FIG. 2 is a top view of the conventional softboard RF device depicted in FIG. 1.
Figure 3:
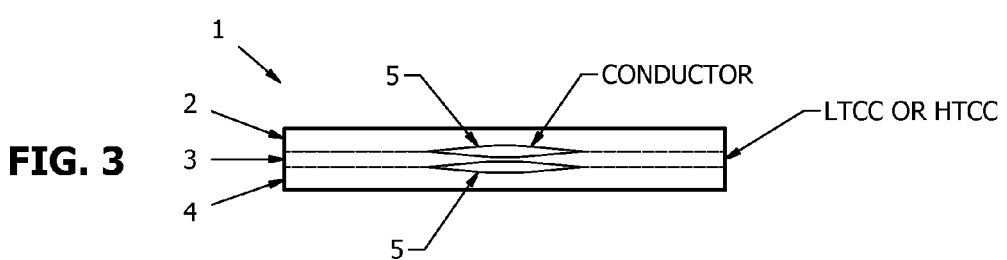
FIG. 3 is a cross-sectional view of a conventional LTCC or HTCC (all-ceramic) device.
Figure 4:
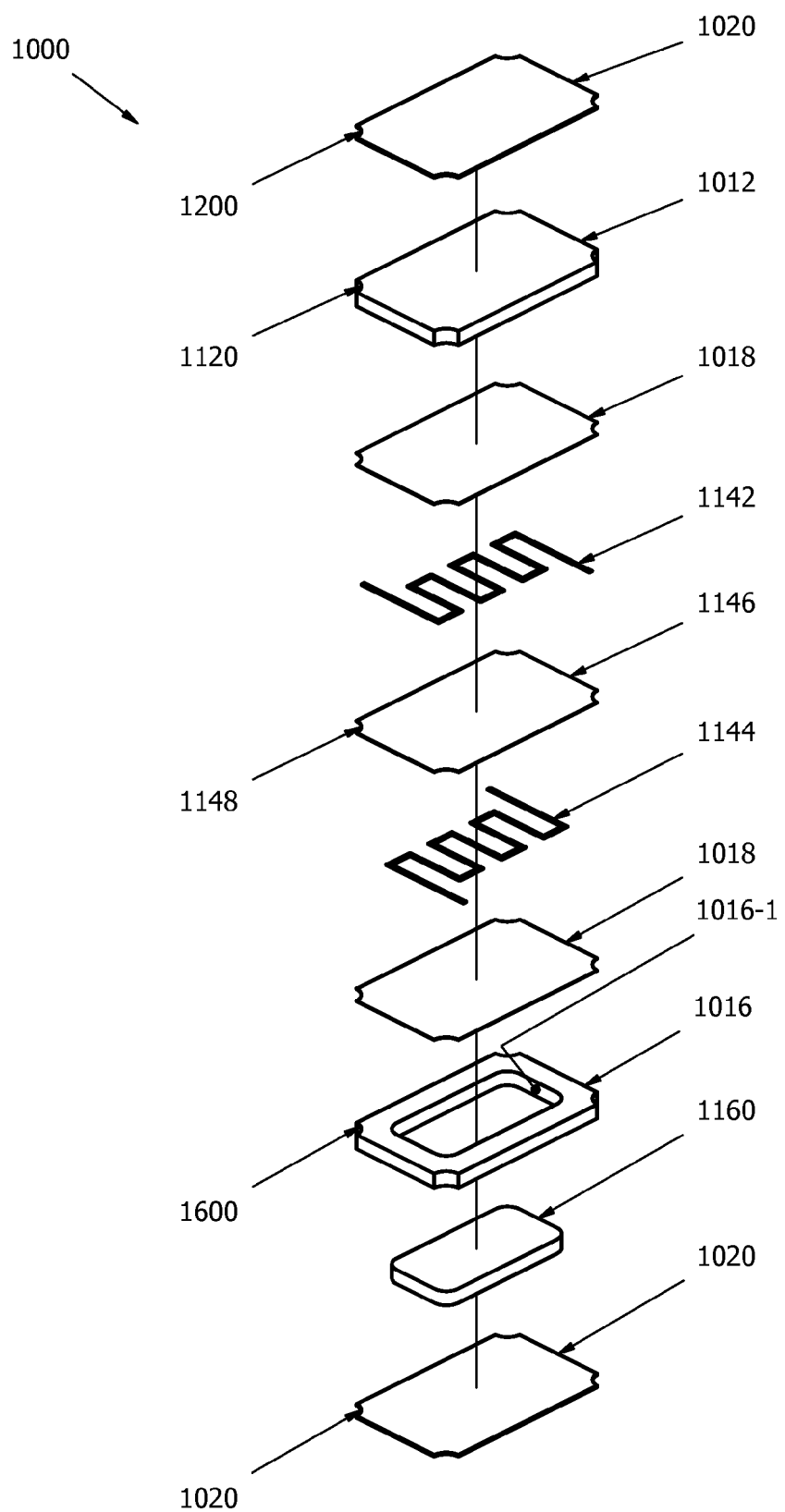
FIG. 4 is an exploded view of a conventional coupler using both ceramic and softboard layers.

In one version of this embodiment, the high power circuitry formed by layers 12-20 are embedded by dielectric layer 11 to prevent arcing due to voltage breakdowns (i.e., to improve peak power handling performance). Another reason for using layer 11 to encapsulate the device 10 may be to provide a corrosion and oxidation resistant component. Moreover, the component can be disposed in a package similar to that shown in FIG. 2. In this case, a PTH 21-4 may be used to route the RF signal to a conductive pad formed on dielectric layer 11.

In another version of this embodiment, the conductive layer 21 may be used to provide a communication interface. For example, PTH 21-4 may be employed to sample a signal propagating in the RF circuit component 20-2 in order to provide signal monitoring to the system control circuitry. In another version of this embodiment, the circuit traces 21-2 may be configured as control circuits. In yet another version of this embodiment, conductive traces 20-2 and 21-2 may provide broadside coupling to enable a re-entrant coupling structure. Branch line coupler geometries are also made possible by this arrangement. In this version, the main circuitry layer 20 is embedded in dielectric material (i.e., between layers 11, 12) to increase the breakdown voltage between the traces so that high power edge coupled applications are enabled.

Obviously, the addition of vias 21-4 increases the complexity (and thus the cost) of the stack-up, but this cost may be viewed as a trade-off. For example, it may be more efficient and cost-effective to implement control circuitry in layers 11, 21 as opposed to providing control circuitry elsewhere in the system. This feature gives the system designer the option to choose the most beneficial approach. There are several ways of forming the (plated through hole) PTH 21-4. On method of forming the vias 21-4 includes the steps of drilling and plating the PTH hole in layer 11 and then bonding layers 11, 21 to the remainder of the laminate stack-up. The second method of forming the vias 21-4 includes the steps of (1) assembling and bonding all of the stack-up layers; (2) laser drilling the vias thru layers 20, 11 and 21; and then plating the drilled holes. Because layer 11 is relatively thin, the drilling step can be accomplished relatively quickly and the plating aspect ratio is also smaller.

In light of the above, when conventional technologies are compared to the present invention, those skilled in the art will appreciate that the present invention provides features and benefits that are not provided by conventional RF devices. As described herein, the power handling capabilities of the device are increased because the thermal energy created by the power flow is effectively dissipated by layers 12-18 of the design. Specifically, none of these layers—especially the core ceramic layer—typically include PTHs or other such openings that interrupt or compromise the flow of heat from the RF conductors to the heat sink. While FIGS. 5A-5B are typically directed to a microstrip design, FIG. 6 shows how the present invention can be applied to any type of coupler design including stripline designs.

As described above and shown in the corresponding drawings, RF device 10 includes bottom conductive layer 18 that can be mounted on, and directly soldered to, a heat sink underneath. Moreover, RF device 10 includes I/O ports that are accessible via the top layer (i.e., layer 20 or layer 21, depending on the embodiment). As demonstrated by the RF assemblies 100 and RF applications 1000 shown and described herein, both of these features provide an end application flexibility that allows the RF device 10 to be mounted in a variety of end-applications in order to eliminate non-value added interfaces.

Because of the versatility associated with the embodiment of FIG. 6, it can be fabricated using a variety of manufacturing processes for both microstrip embodiments and stripline embodiments. In one method of making the RF device 10 of the present invention, layers 11, 20 and 21 are stacked and bonded together to form a sub-assembly. Layer 11 may be implemented using any suitable printed circuit board, and layers 20, 21 may be implemented in this case by 0.7 mil layers of copper foil. After these layers are bonded, circuit patterns, e.g. for the monitoring circuits and the high power RF circuitry may be formed on layer 20 and 21 using standard photolithographic techniques. After the excess copper is removed by etching, interconnection holes are drilled using one of the techniques described herein. The interconnection holes are copper plated and selected portions of the sub-assembly are finish plated. After this, the ceramic sub-assembly and layers 12-18 are disposed in a stack-up and fusion bonded. (Layers 12-18 may be comprised of any of the materials described and disclosed above. For example, the layers 12 and 16 may be implemented using 5 mil Rogers 3035 HTC softboard, the ceramic layer 14 may be realized by a 40 mil thick layer of $Al_2O_3$ and conductive layer 18 by 0.7 mil copper foil). Additional etching may be performed on layer 21 after the assembly is bonded together. As before, the panel may be finished using an ENIG surface plating process wherein an electroless nickel plating is covered with a thin layer of immersion gold in order to protect the copper from oxidation. Again, other finishes may be employed, such as immersion tin, immersion silver or a tin/lead alloy. Finally, the panel is singulated to provide a plurality of RF devices 10.

In an alternate procedure for making RF devices 10 of the present invention, layers 11, 20 and 21 are stacked and bonded together to form a sub-assembly. Layer 11 may be implemented using any suitable printed circuit board and layers 20, 21 are implemented using, e.g., 1.4 mil layers of copper foil. After these layers are bonded, circuit patterns for layer 20 are formed using standard photolithographic techniques and the excess copper is removed by etching. Next, the remaining layers 12-18 and the sub-assembly are stacked together and fusion bonded. At this point, interconnection holes can be drilled using a laser or a suitable mechanical means. After the circuitry is formed on the top layer 21, the panel is finish plated using one of the methods described previously. As before, the panel is singulated to provide a plurality of RF devices 10.

In yet another alternate procedure of the present invention, the first manufacturing process described above can be modified by eliminating the intermediate step of etching layer 21 (after fusion bonding the subassembly and layers 12-18).

Figure 7A:
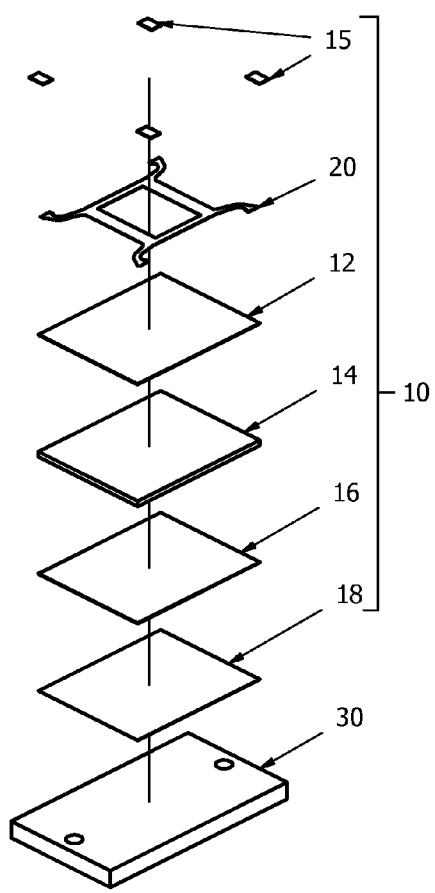
FIGS. 7A-7C are directed to various views of an RF assembly in accordance with another embodiment of the present invention.
Figure 7B:
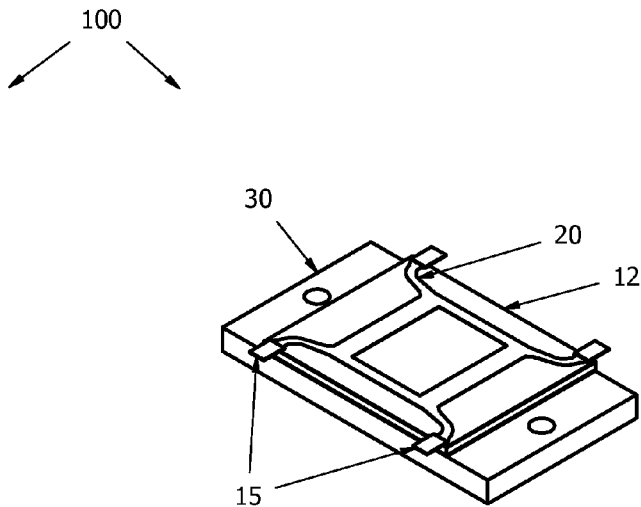
Figure 7C:
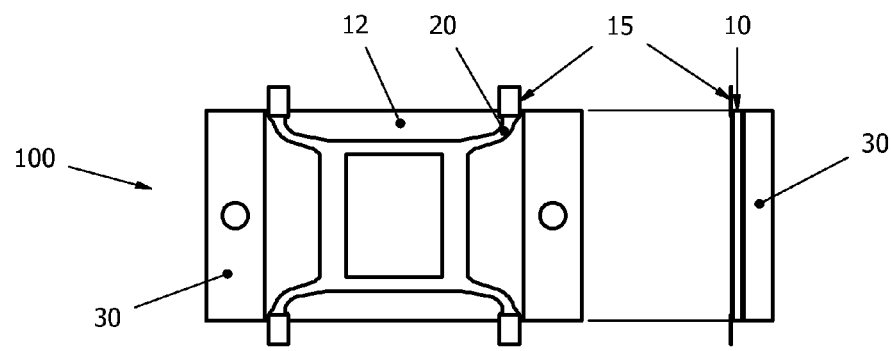

Referring to FIGS. 7A-7C, various views of an RF assembly 100 in accordance with another embodiment of the present invention are depicted. FIG. 7A is directed to an exploded view of RF assembly 100. In this example embodiment, thermoplastic layer 12 may be configured using any suitable materials such as, for example, a 5 mil thick softboard (See, e.g., RO3035HTC, RO3006HTC, RO6035HTC, etc. softboards manufactured by Rogers, or softboards TC350, TC600, etc. made by Arlon). Layer 20 is shown in this view as an RF coupler trace disposed on a thin low modulus dielectric layer 12 that may be realized using a 1.4 mil layer of copper foil coupled to the softboard layer. In this example, the ceramic core 14 may be comprised of a 40 mil layer of alumina. Thermoplastic layer 16 may be configured using any suitable materials such as, for example, as a 5 mil thick softboard (See, e.g., RO3035HTC, RO3006HTC, RO6035HTC, etc. manufactured by Rogers or TC350, TC600, etc. made by Arlon) with the attached 1.4 mil thick copper foil functioning as ground layer 18. The RF assembly 100 is completed by soldering the copper layer 18 to a copper flange 30 which functions as a heat sink. Note that the copper flange 30 includes two screw holes. The screw holes provide a means for fastening the flange 30 to a primary heat sink.

FIG. 7B shows an isometric view of the RF assembly 100 and FIG. 7C provides a plan view of the RF assembly 100. In both of these views, the copper circuit traces 20 are shown as being easily accessible via the top major surface of the RF device 10. In this view, optional leads 15 are shown connected to I/O ports. The optional leads 15 may be used to connect the RF device 10 to the end-application PCB. Alternatively, the end-application components (e.g., a transistor with output leads) can be mounted directly onto I/O ports.

Figure 8A:
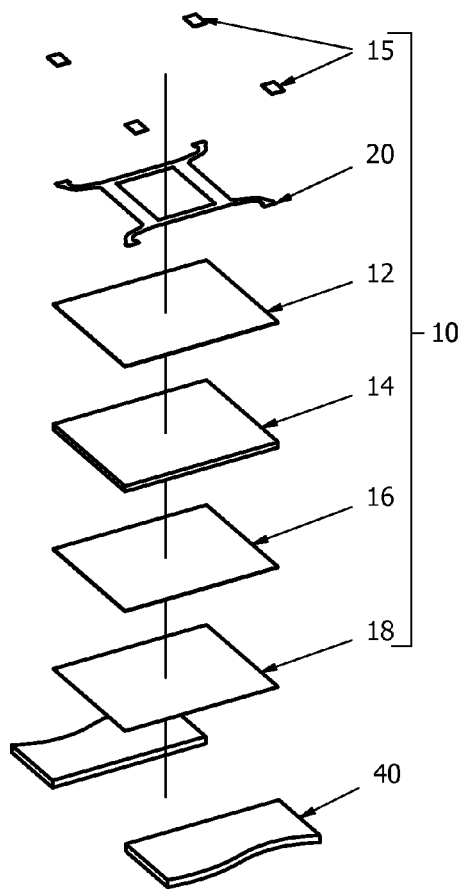
FIGS. 8A-8C are directed to various views of an RF assembly in accordance with yet another embodiment of the present invention.
Figure 8B:
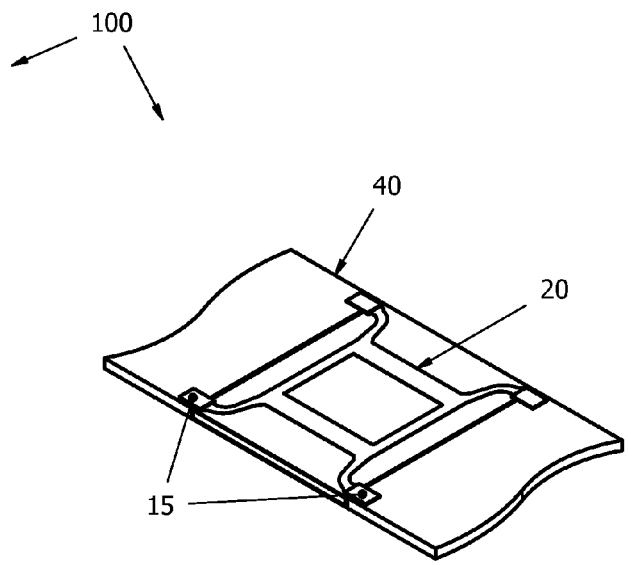
Figure 8C:
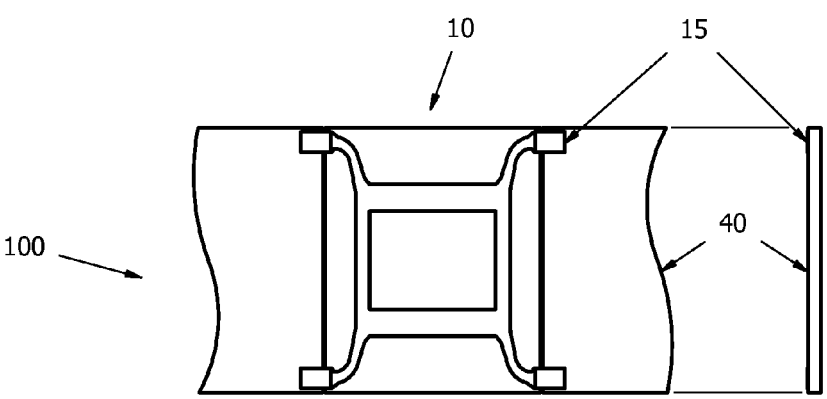

In reference to FIGS. 8A-8C, various views of an RF assembly 100 in accordance with yet another embodiment of the present invention are disclosed. In this embodiment, layer 20 is again implemented as an RF coupler trace that is disposed on a thin low modulus dielectric layer 12. The I/O legs of the coupler 20 are connected to I/O pads 15. The remainder of the coupler structure 10 is identical to the coupler 10 depicted in FIGS. 7A-7C. Since the same reference numbers are used throughout the drawings to refer to the same or like parts, any description of the elements fully described above would be redundant and thus omitted for brevity's sake. In this embodiment, the RF assembly 100 is completed by soldering the copper layer 18 directly to a heat sink disposed under the end application printed circuit board 40. (Note that a substantially rectangular opening is formed in PCB 40 that accommodates the RF assembly 10). FIG. 8B is an isometric view of the RF assembly 100 and FIG. 8C provides a plan view of the RF assembly 100. In both of these views, the I/O pads 15 span the distance between the PCB 40 and the top major surface of layer 12 to provide a direct and convenient RF interface between the RF coupler 10 leads and the end application circuit.

In lower power handling applications, the PCB cutout is eliminated so that the RF device 10 is directly mounted on the PCB as a surface mount component. In this version, the device 10 is soldered directly onto the PCB, but the leads 15 must be somewhat longer in order to span the distance between PCB 40 and the top circuit trace 20.

Referring to FIGS. 9A-9C, various views of an RF assembly 100 in accordance with yet another embodiment of the present invention are disclosed. In this embodiment, layer 20 is again implemented as an RF coupler trace that is disposed on a thin low modulus dielectric layer 12. The I/O legs of the coupler 20 are connected to upturned I/O pads 15, which in turn, can be connected to PCB 40. The remainder of the coupler structure 10 is identical to the coupler 10 depicted in FIGS. 7A-7C. As before, the same reference numbers are used throughout the drawings to refer to the same or like parts so that any description of the elements fully described above is redundant and omitted for brevity's sake. In this embodiment, the RF assembly 100 is completed by soldering the copper layer 18 directly to the PCB 40. Thus, this embodiment of the RF assembly 100 includes features from the previous two RF assembly 100 embodiments (i.e., from FIGS. 7-8).

FIG. 9B shows an isometric view of the RF assembly 100 and FIG. 9C provides a plan view of the RF assembly 100. In both of these views, the I/O pads 15 are configured to step down from the top major surface of layer 20 to interface the PCB 40. This arrangement provides a direct and convenient RF interface between the RF coupler 10 leads and the end application circuit on PCB 40.

Figures 10A, 10B, 10C:
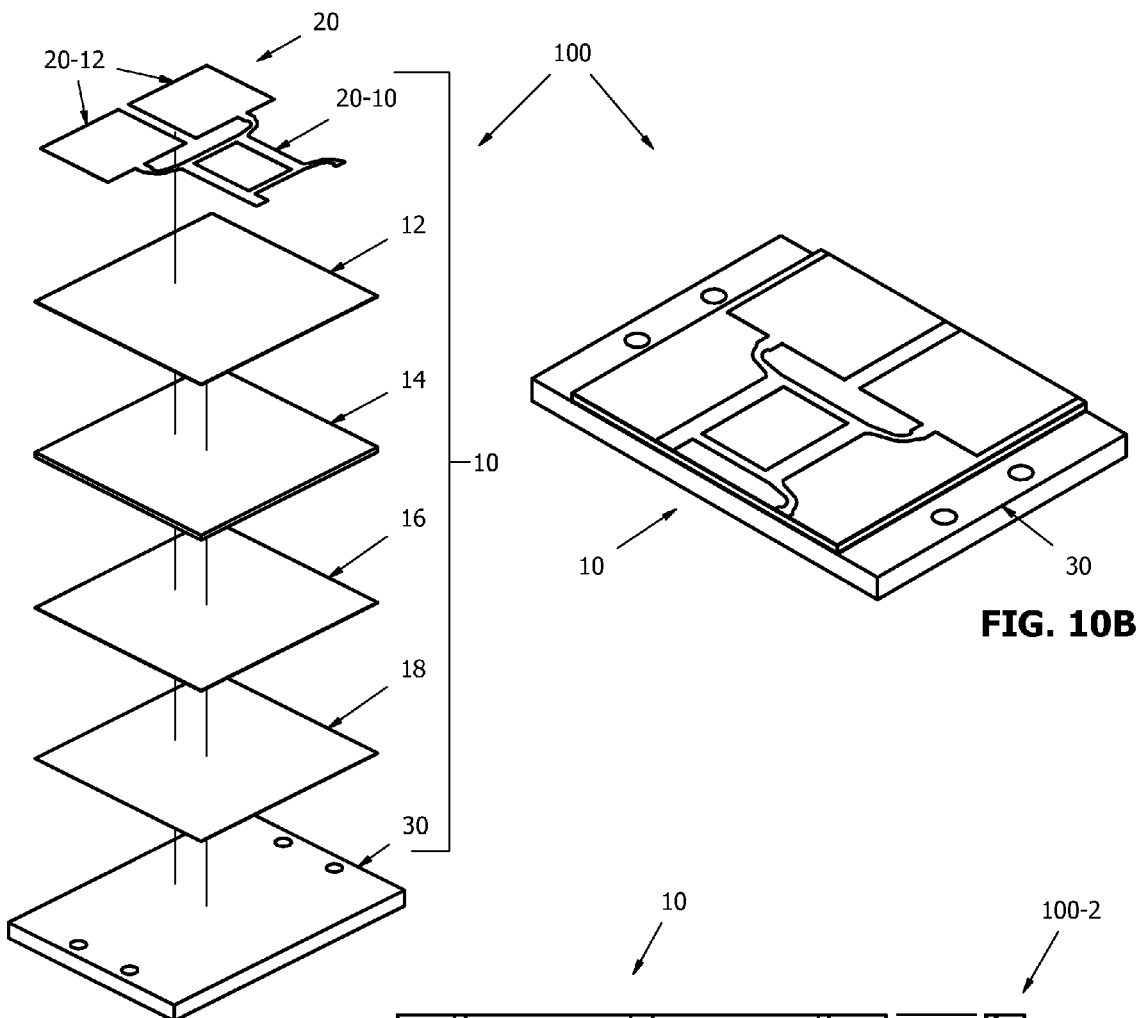
FIGS. 10A-10C are directed to various views of an RF assembly in accordance with yet another embodiment of the present invention.

Turning now to FIGS. 10A-10C, various views of an RF assembly 100 in accordance with yet another embodiment of the present invention is disclosed. As before, the same reference numbers are used throughout the drawings to refer to the same or like parts; thus, a description of the elements fully described above would be redundant and is omitted for brevity's sake. This embodiment is similar to the embodiment depicted in FIGS. 7A-7C. To be specific, the layers 12-30 in FIGS. 10A-10C are identical to the layers 12-30 in FIGS. 7A-7C. The difference between these two embodiments relates to the circuit layer 20. In this embodiment, the layer 20 includes RF coupler traces 20-10 that are coupled to an impedance matching network 20-12. By including an impedance network 20-12 on the RF device 10, the need to include additional PCB/circuitry in the end-application is eliminated. Moreover, this simplifies the RF assembly/end-application interface by allowing the RF components (10, 100) to be simply dropped into place and interconnected by virtue of the interconnection tabs 15. This embodiment may be employed in any of the previous RF assembly embodiments depicted in FIGS. 7-9.

Figure 11A:
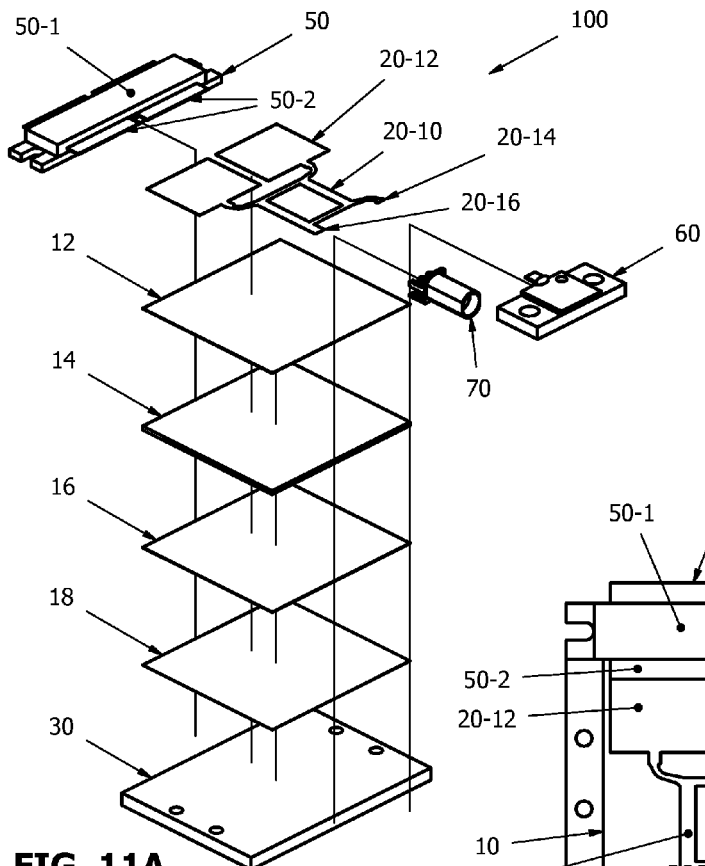
FIGS. 11A-11C are directed to various views of an RF assembly in accordance with yet another embodiment of the present invention.
Figure 11B:
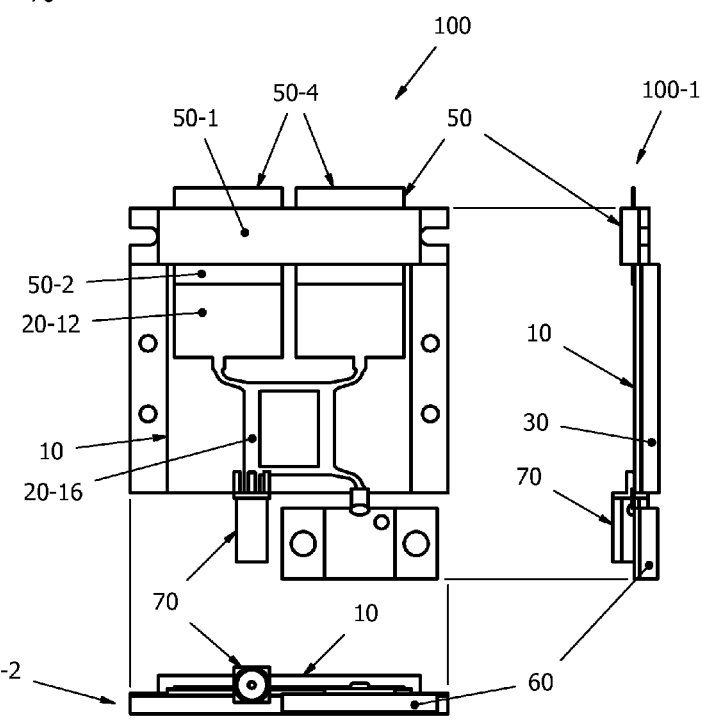
Figure 11C:
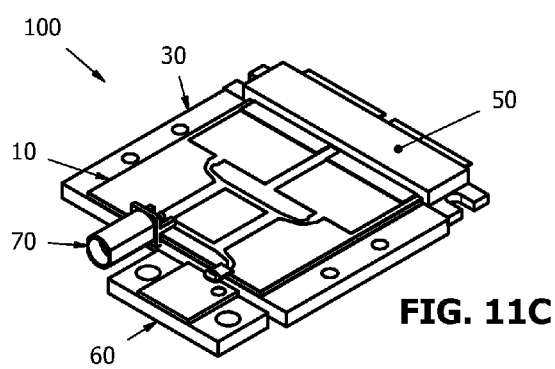

In reference to FIGS. 11A-11C, various views of an RF assembly 100 in accordance with yet another embodiment of the present invention are disclosed. FIG. 11A provides an exploded view of RF assembly 100, FIG. 11B shows plan, side and end views of the RF assembly 100, and FIG. 11C provides an isometric view of the RF assembly 100. This embodiment includes elements that are identical to those depicted in FIGS. 10A-10C, and since the same reference numbers are used throughout the drawings to refer to the same or like parts, any description of elements fully described above would be redundant and thus omitted for brevity's sake. On the other hand, this embodiment includes several additional elements that were not described above. Note the RF assembly includes an amplifier module 50, a load element 60 and an edge mounted connector 70. The amplifier module 50 includes a transistor pair 50-1 that is connected to the impedance network 20-12 of RF device 10 by transistor output pads 50-2. The transistor also includes input pads 50-4. The coupler 20-10 includes one output port 20-14 that is connected to the load resistor 60 and another output 20-16 that is connected to the edge mounted output connector 70. Note that the resistor 60 is mounted on its own heat sink flange. Those of ordinary skill in the art will appreciate that the edge mounted connector 70 may be coupled to a cable connector to provide RF output power to an antenna or some other type of other load in accordance with the end-application 1000 (not shown in this view).

Figure 12A:
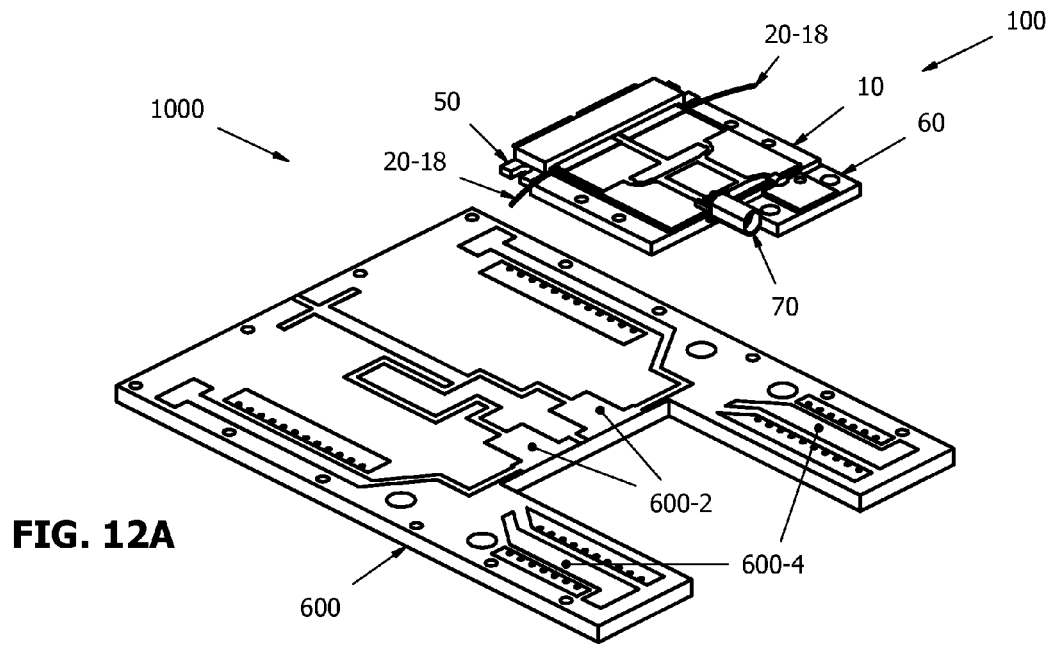
FIGS. 12A-12B are directed to an RF application using the RF assembly depicted in FIGS. 11A-11C.
Figure 12B:
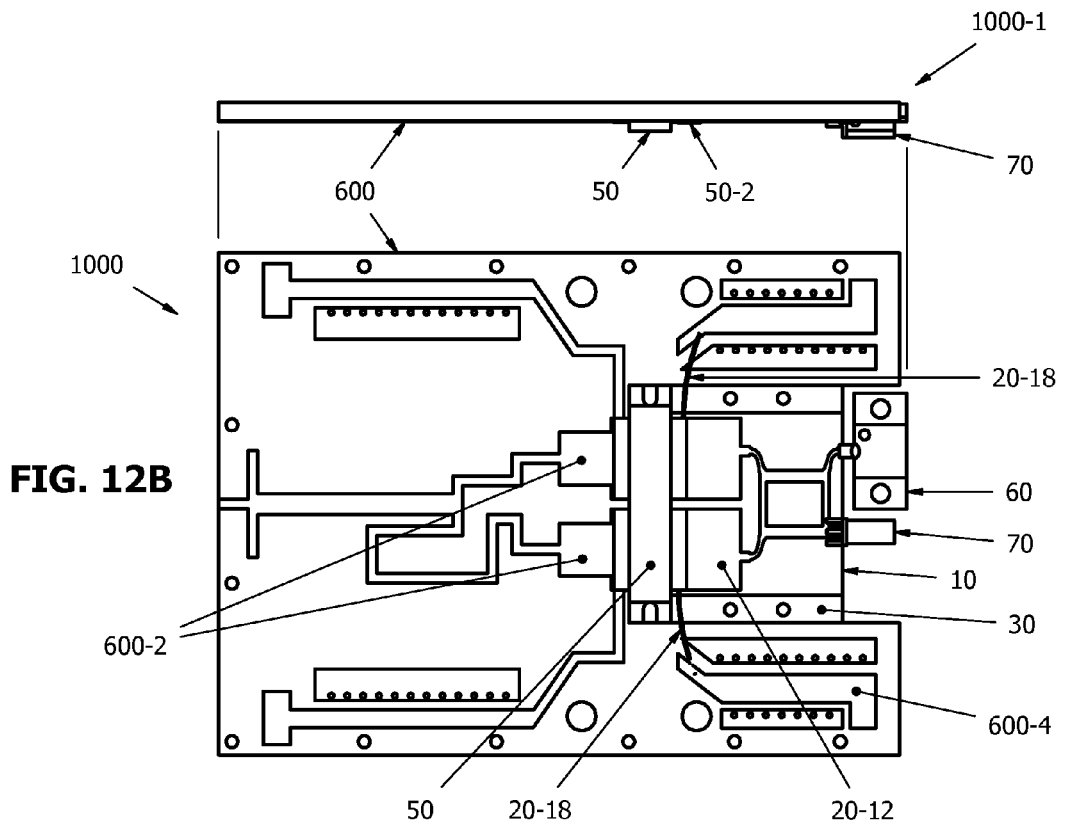

FIGS. 12A-12B are directed to an RF application 1000 using the RF assembly 100 depicted in FIGS. 11A-11C. FIG. 12A provides an exploded view of RF application 1000 and FIG. 12B shows plan and side views (1000-1) of the RF application 1000. The RF application 1000 includes an end application printed circuit board 600 that is configured to include, inter alia, small signal input pads 600-2 and, e.g., a DC biasing network 600-4. In this embodiment, a wire 20-18 is connected between the transistor outputs 50-2 and the DC biasing network 600-4. The small signal pads 600-2 are shown as being connected to the input pads 50-4 of the transistor 50-1. The transistor outputs 50-2 are connected to the output impedance matching network (not labeled in this view for clarity of illustration) on RF device 10.

FIGS. 13A-13E are directed to yet another RF application 1000 that uses a modified RF assembly 100 that is almost identical to the assembly depicted in FIGS. 12A-12C. In reference to FIGS. 13A and 13B, the wire leads 20-18 shown above are replaced by conductive taps 20-19 formed on layer upper dielectric layer 12. Like wires 20-18, the taps 20-19 extend from the interface between impedance network 20-12 and the transistor outputs 50-2.

Figure 13A:
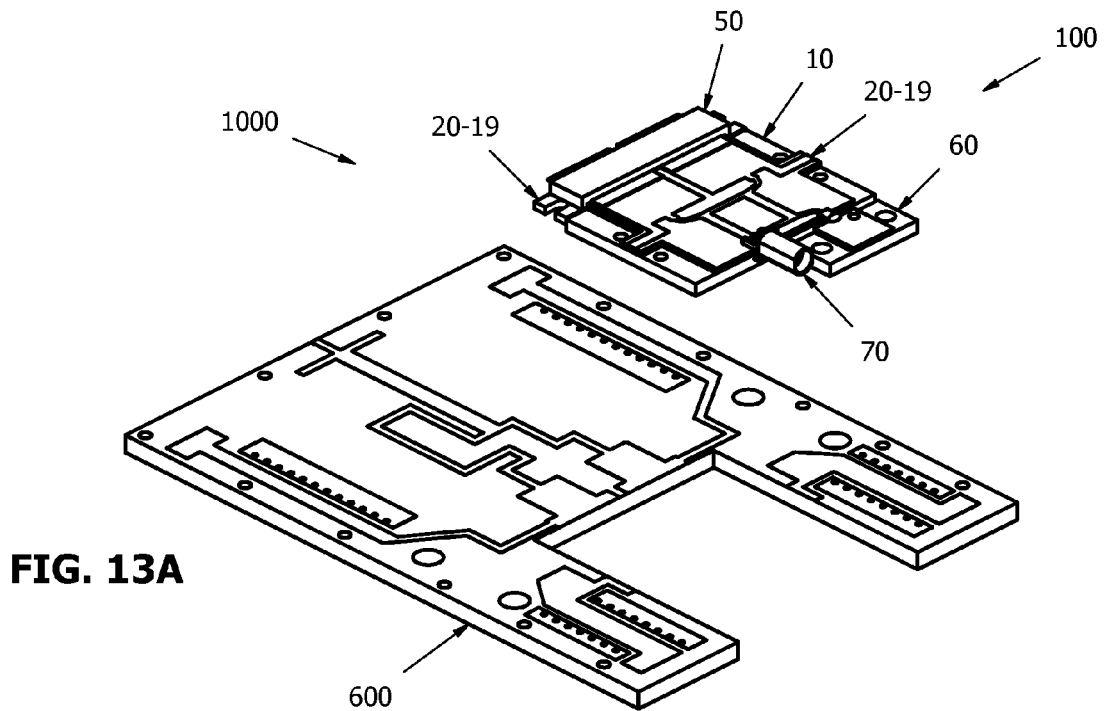
FIGS. 13A-13E are directed to yet another RF application using a modified RF assembly similar to the assembly depicted in FIGS. 11A-11C.
Figure 13B:
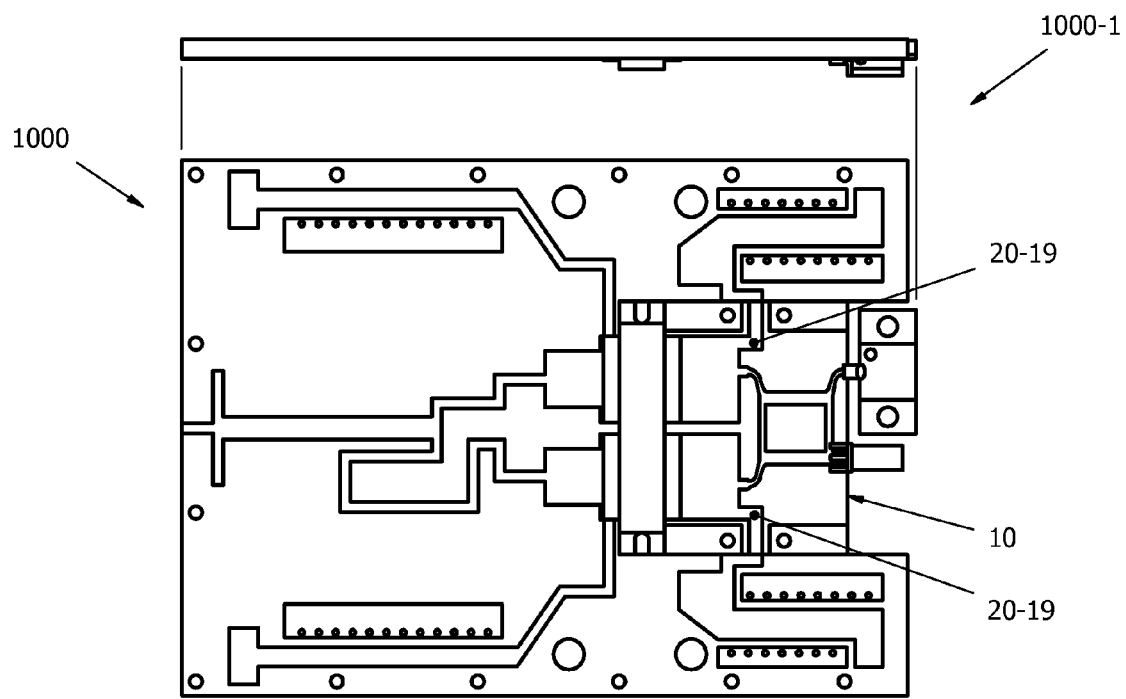
Figure 13C:
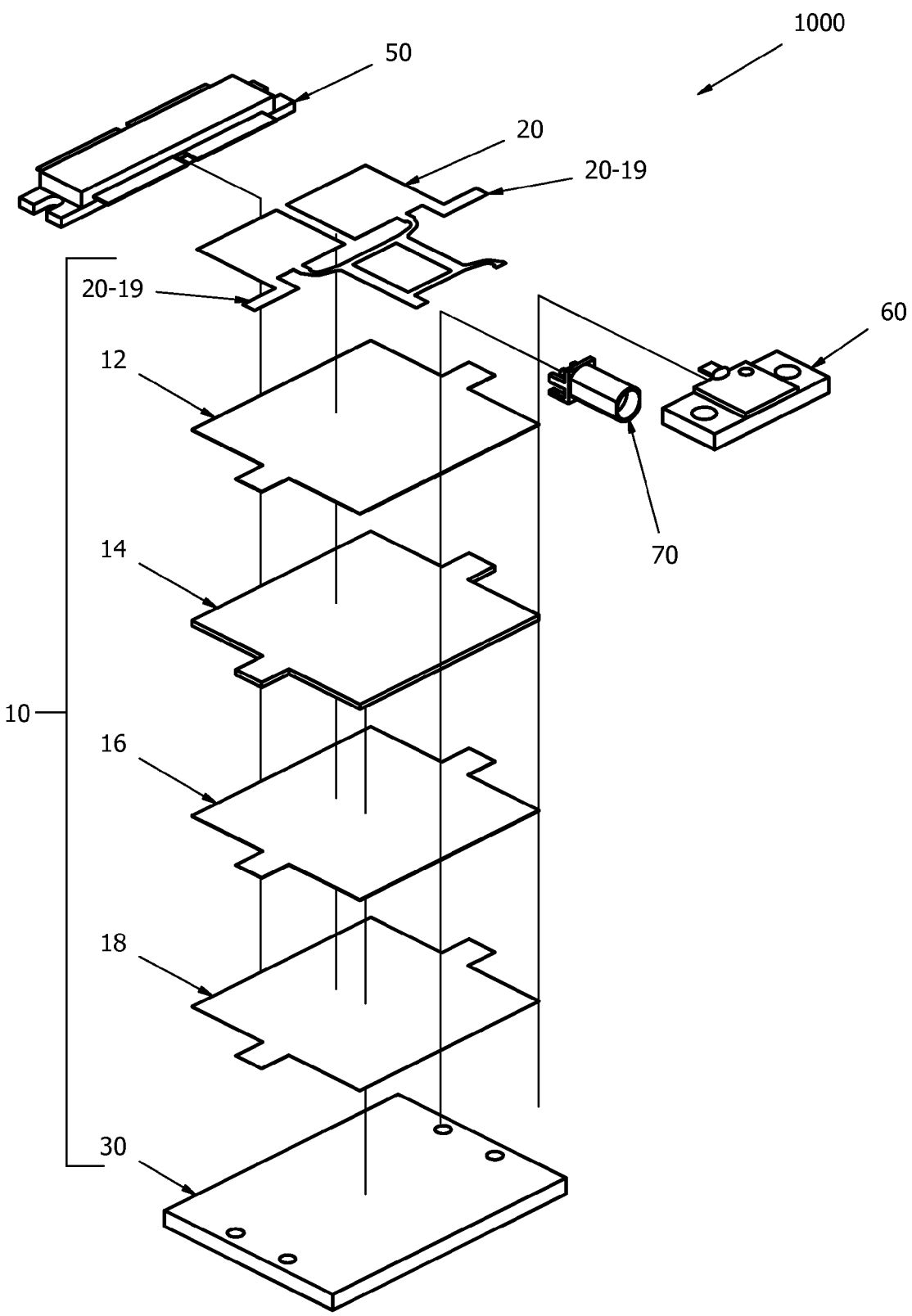
Figure 13D:
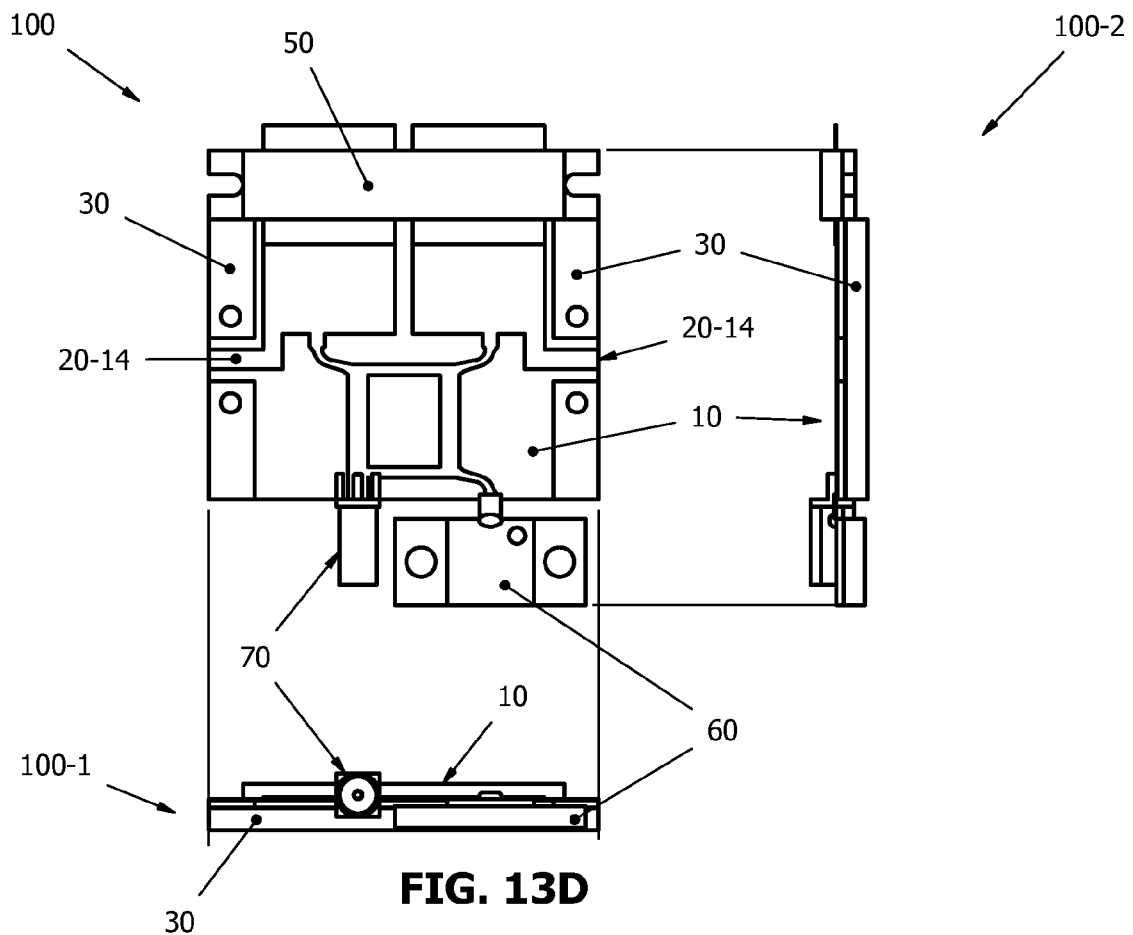
Figure 13E:
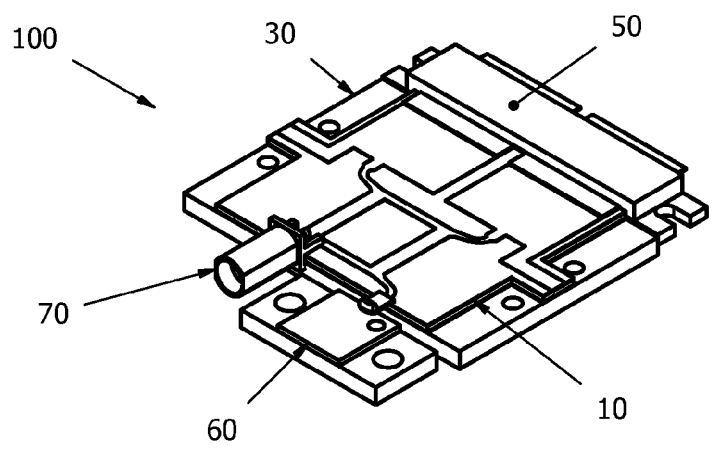

Turning to FIG. 13C, an exploded view of the RF assembly 100 employed in FIGS. 13A-B is provided. FIG. 13D shows plan, side and end views of the RF assembly 100, and FIG.

13E provides an exploded view of the RF assembly 100. As one might suspect, the difference between this exploded view and the one provided in FIG. 11A relates to the conductive taps 20-19 formed on the upper dielectric layer 12. The various layers 12-18 include side tab portions (not labeled for clarity of illustration) that provide mechanical support and RF signal continuity between the RF device 10 and the application PCB 600 (not shown in FIGS. 13C-E). Again, since the same reference numbers are used throughout the drawings to refer to the same or like parts, any description of the elements fully described above would be redundant and thus omitted for brevity's sake.

Figure 14A:
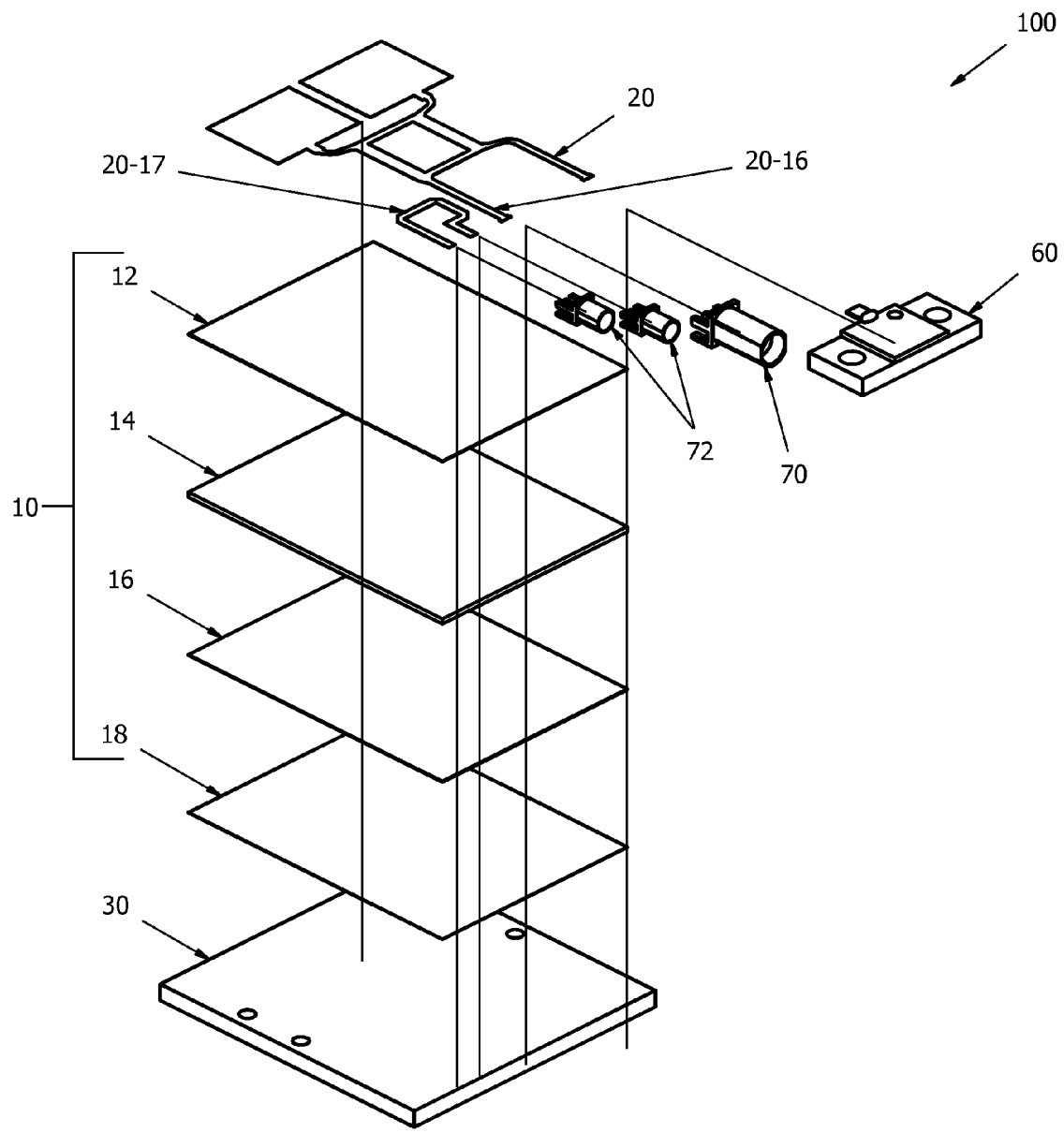
FIGS. 14A-14C are directed to various views of an RF assembly in accordance with yet another embodiment of the present invention.
Figure 14B:
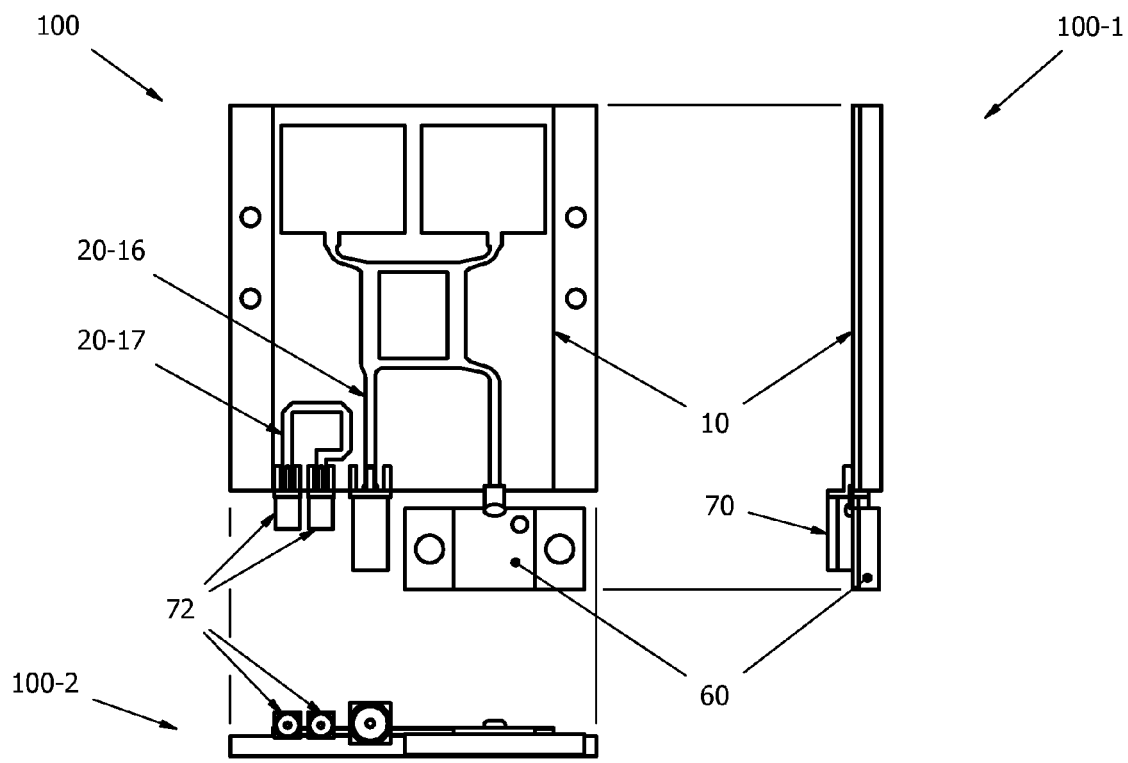
Figure 14C:
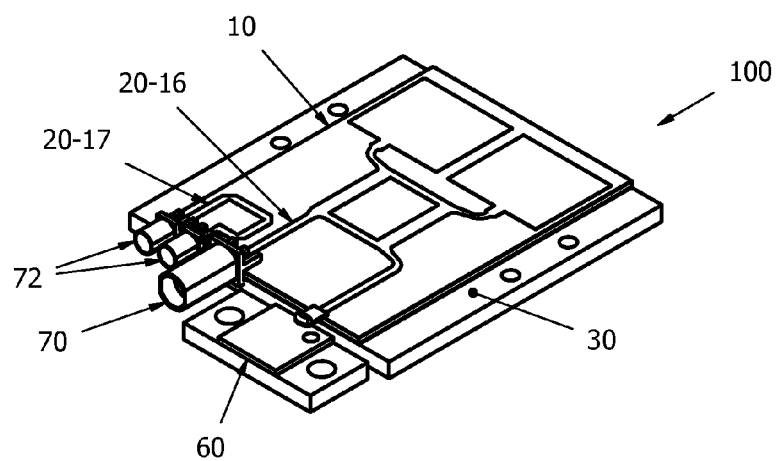

FIGS. 14A-14C are directed to various views of an RF assembly in accordance with yet another embodiment of the present invention. FIG. 14A provides an exploded view of RF assembly 100, FIG. 14B shows plan, side and end views of the RF assembly 100, and FIG. 14C provides an isometric view of the RF assembly 100. This embodiment includes elements that are identical to those depicted in FIGS. 11A-11C. Thus, the RF assembly 100 includes an amplifier module 50, a load element 60 and an edge mounted connector 70 shown above. Again, since the same reference numbers are used throughout the drawings to refer to the same or like parts, any description of the elements fully described above would be redundant and thus omitted for brevity's sake. On the other hand, this embodiment includes several additional elements that were not described above. A sampling coupler 20-17 is formed on the top major surface of layer 12. The plan-view provided in FIG. 14B shows that the sampling coupler 20-17 is disposed adjacent to the power output leg 20-16 of the RF device 10. A small amount of RF power is coupled from the RF output 20-16 into the sampling coupler 20-17. The RF sampling power is accessible to the end application via the edge mounted SMA connectors 72.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto; inventive embodiments may be practiced otherwise than as specifically described and claimed.

All references, including publications, patent applications, and patents, cited herein are hereby incorporated by reference to the same extent as if each reference were individually and specifically indicated to be incorporated by reference and were set forth in its entirety herein.

All definitions, as defined and used herein, should be understood to control over dictionary definitions, definitions in documents incorporated by reference, and/or ordinary meanings of the defined terms.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

Approximating language, as used herein throughout the specification and claims, may be applied to modify any quantitative representation that could permissibly vary without resulting in a change in the basic function to which it is related. Accordingly, a value modified by a. term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

In the claims, as well as in the specification above, all transitional phrases such as "comprising," "including," "carrying," "having," "containing," "involving," "holding,"

"composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. An RF device comprising:
   a laminate structure including a first layer of thermoplastic material characterized by a modulus of elasticity that is a function of the RF device operating temperature, a first major surface of the first layer of thermoplastic material substantially forming a first major surface of the laminate structure, a second major surface of the first layer of thermoplastic material being bonded to a first major ceramic surface of a ceramic layer having a predetermined thermal conductivity that is a function of a predetermined RF device operating temperature, the ceramic layer having a second major ceramic surface bonded to a second layer of thermoplastic material, the second layer of thermoplastic material being bonded to a conductive layer that forms a second major surface of the laminate structure, the second layer of thermoplastic material having a coefficient of thermal expansion that substantially matches the conductive layer; and
   a first circuit arrangement disposed on the first major surface of the laminate structure, the first circuit arrangement including at least one first RF circuit structure having a predetermined geometry and predetermined electrical characteristics in accordance with the predetermined RF device operating temperature, the laminate structure being configured to dissipate thermal energy generated by the at least one first RF circuit structure via substantially the entire second major surface of the laminate structure.

2. The device of claim 1, wherein the predetermined thermal conductivity of the ceramic layer is substantially within a range between about 3 W/mK and 300 W/mK.

3. The device of claim 1, wherein the coefficient of thermal expansion of the second layer of thermoplastic material is substantially within a range between 15 ppm/° C. and 25 ppm/° C.

4. The device of claim 1, wherein the ceramic layer is selected from a group of materials that include alumina ($Al_2O_3$), Aluminum Nitride (AlN) or Beryllium Oxide (BeO).

5. The device of claim 1, wherein at least one of the first layer of thermoplastic material and the second layer of thermoplastic material are comprised of a PTFE material.

6. The device of claim 5, wherein the PTFE materials are doped with a ceramic filler material.

7. The device of claim 1, wherein the at least one first RF circuit structure and the conductive layer form at least one microstrip RF circuit.

8. The device of claim 1, wherein the first circuit arrangement includes I/O pads coupled to the at least one RF circuit structure and substantially disposed on the first major surface of the laminate structure.

9. The device of claim 8, wherein the laminate structure is characterized by a two-dimensional footprint corresponding to an end-application mounting interface.

10. The device of claim 1, wherein the first circuit arrangement includes a third layer of thermoplastic material configured to substantially encapsulate the first major surface of the laminate structure.

11. The device of claim 1, wherein the first circuit arrangement includes a third layer of thermoplastic material coupled to a second circuit arrangement substantially parallel to the first RF circuit.

12. The device of claim 11, wherein the second circuit arrangement includes monitoring circuitry or control circuitry coupled to the first RF circuit.

13. The device of claim 11, wherein the second circuit arrangement includes a second RF circuit.

14. The device of claim 13, wherein the first RF circuit and the second RF circuit are configured to form an RF arrangement selected from a plurality of RF arrangements including a cross over arrangement, a coupling arrangement, or a matching network arrangement.

15. The device of claim 1, wherein the first circuit arrangement includes a power sampling coupler arrangement electromagnetically coupled to the at least one RF circuit structure and substantially disposed on the first major surface of the laminate structure.

16. The device of claim 1, wherein the laminate structure includes no conductive vias or through-holes formed therein.

17. An RF assembly comprising: a mounting interface characterized by a two-dimensional footprint and the RF device of claim 1, the laminate structure being disposed on the mounting interface, the mounting interface having a coefficient of thermal expansion (CTE) substantially matched to the conductive layer, the RF assembly further including at least one RF element coupled to the first circuit arrangement.

18. The RF assembly of claim 17, wherein the first circuit arrangement includes I/O interconnections coupling the at least one RF element and the at least one RF circuit structure, the I/O interconnections being substantially disposed on the first major surface of the laminate structure.

19. The RF assembly of claim 17, wherein the mounting interface is selected from a group of mounting interfaces that include a metallic flange element, a heat sink structure, a heat sink structure disposed within an opening in a printed circuit board, or a PCB.

20. The RF assembly of claim 17, wherein at least one RF element is selected from a group of RF elements including a transistor, an RF power amplifier, an RF load, a filter, an antenna, and an edge mounted connector.

21. An RF device comprising:
   a laminate structure including a ceramic layer having a predetermined thermal conductivity that is a function of a predetermined RF device operating temperature, the ceramic layer having a first major ceramic surface that forms a first major surface of the laminate structure and a second major ceramic surface bonded to a layer of thermoplastic material, the layer of thermoplastic material being bonded to a conductive layer that forms a second major surface of the laminate structure, the layer of thermoplastic material having a coefficient of thermal expansion that substantially matches the conductive layer; and a first circuit arrangement disposed on the first major surface of the laminate structure, the first circuit arrangement including at least one first RF circuit structure having a predetermined geometry and predetermined electrical characteristics in accordance with the predetermined RF device operating temperature, the laminate structure being configured to dissipate thermal energy generated by the at least one first RF circuit structure via substantially the entire second major surface of the laminate structure.

22. The device of claim 21, wherein the predetermined thermal conductivity of the ceramic layer is substantially within a range between about 3 W/mK and 300 W/mK.

23. The device of claim 21, wherein the coefficient of thermal expansion of the layer of thermoplastic material is substantially within a range between 15 ppm/° C. and 25 ppm/° C.

24. The device of claim 21, wherein the ceramic layer is selected from a group of materials that include alumina ($Al_2O_3$), Aluminum Nitride (AlN) or Beryllium Oxide (BeO).

25. The device of claim 21, wherein the layer of thermoplastic material is comprised of a PTFE material.

26. The device of claim 25, wherein the PTFE materials are doped with a ceramic filler material.

27. The device of claim 21, wherein the at least one first RF circuit structure and the laminate layer form at least one microstrip RF circuit.

28. The device of claim 21, wherein the first circuit arrangement includes I/O pads coupled to the at least one RF circuit structure and substantially disposed on the first major surface of the laminate structure.

29. The device of claim 21, wherein the first circuit arrangement is formed using a process selected from a group of processes including a thick film metallization process, a thin film metallization process, and a direct plate copper (DPC) process.

30. The device of claim 21, wherein the laminate structure includes no conductive vias or through-holes formed therein.

31. A method of making an RF device, the method comprising:

providing a ceramic layer having a predetermined thermal conductivity that is a function of a predetermined RF device operating temperature;
providing a second layer of thermoplastic material;
providing a conductive layer;
assembling the first layer, the ceramic layer, the second layer and the conductive layer in sequence to form a device stack-up; and
laminating the stack-up to form a laminate structure, the second layer of thermoplastic material having a coefficient of thermal expansion that substantially matches the conductive layer.

32. The method of claim 31, further comprising the step of providing a first layer of thermoplastic material characterized by a modulus of elasticity that is a function of the RF device operating temperature.

33. The method of claim 31, further comprising the step of forming a first circuit arrangement on the first major surface of the laminate structure, the first circuit arrangement including at least one first RF circuit structure having a predetermined geometry and predetermined electrical characteristics in accordance with the predetermined RF device operating temperature, the laminate structure being configured to dissipate thermal energy generated by the at least one first RF circuit structure via substantially the entire second major surface of the laminate structure.

34. The method of claim 31, wherein the predetermined thermal conductivity of the ceramic layer is substantially within a range between about 3 W/mK and 300 W/mK.

35. The method of claim 31, wherein the coefficient of thermal expansion of the second layer of thermoplastic material is substantially within a range between 15 ppm/° C. and 25 ppm/° C.

36. The method of claim 31, wherein the ceramic layer is selected from a group of materials that include alumina ($Al_2O_3$), Aluminum Nitride (AlN) or Beryllium Oxide (BeO).

37. The method of claim 31, wherein at least one of the first layer of thermoplastic material and the second layer of thermoplastic material is comprised of a PTFE material.

38. The method of claim 37, wherein the PTFE materials are doped with a ceramic filler material.

* * * * *